(12) United States Patent
Yamamoto

(10) Patent No.: US 11,810,926 B2
(45) Date of Patent: Nov. 7, 2023

(54) SEMICONDUCTOR DEVICE

(71) Applicant: RENESAS ELECTRONICS CORPORATION, Tokyo (JP)

(72) Inventor: Yoshiki Yamamoto, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/514,493

(22) Filed: Oct. 29, 2021

(65) Prior Publication Data
US 2022/0157863 A1 May 19, 2022

(30) Foreign Application Priority Data
Nov. 19, 2020 (JP) .................. 2020-192122

(51) Int. Cl.
*H01L 27/13* (2006.01)
*H01L 21/84* (2006.01)
*H01L 27/12* (2006.01)

(52) U.S. Cl.
CPC .............. *H01L 27/13* (2013.01); *H01L 21/84* (2013.01); *H01L 27/1203* (2013.01)

(58) Field of Classification Search
CPC ..... H01L 27/13; H01L 21/84; H01L 29/6653; H01L 29/6659; H01L 29/66628; H01L 27/0629; H01L 27/1203; H01L 29/665
USPC .......................................... 257/350; 438/152
See application file for complete search history.

(56) References Cited

U.S. PATENT DOCUMENTS

| 10,121,846 B1* | 11/2018 | Zaka et al. ............ H01L 28/210 |
| 2007/0040222 A1 | 2/2007 | Van Camp et al. |
| 2007/0215944 A1 | 9/2007 | Komatsu |
| 2015/0054081 A1* | 2/2015 | Adam et al. ........ H01L 27/1203 257/350 |

FOREIGN PATENT DOCUMENTS

| JP | 09-219493 A | 8/1997 |
| JP | 2007-242660 A | 9/2007 |

OTHER PUBLICATIONS

Extended European Search Report issued in corresponding European Patent Application No. 21207869.5-1212, dated Sep. 16, 2022.

* cited by examiner

*Primary Examiner* — Thinh T Nguyen
(74) *Attorney, Agent, or Firm* — McDermott Will & Emery LLP

(57) ABSTRACT

Improving a reliability of a semiconductor device. A resistive element is comprised of a semiconductor layer of the SOI substrate and an epitaxial semiconductor layer formed on the semiconductor layer. The epitaxial semiconductor layer EP has two semiconductor portions formed on the semiconductor layer and spaced apart from each other. The semiconductor layer has a region on where one of the semiconductor portion is formed, a region on where another of the semiconductor portion is formed, and a region on where the epitaxial semiconductor layer is not formed.

17 Claims, 29 Drawing Sheets

SEMICONDUCTOR DEVICE

CROSS-REFERENCE TO RELATED APPLICATIONS

The disclosure of Japanese Patent Application No. 2020-192122 filed on Nov. 19, 2020 including the specification, drawings and abstract is incorporated herein by reference in its entirety.

BACKGROUND

The present invention relates to a semiconductor device, for example, the present invention relates to a technique which can be applied to a semiconductor device having a resistive element.

To manufacture a semiconductor device, an element isolation region is formed on a semiconductor substrate, a semiconductor element such as MISFET (Metal Insulator Semiconductor Field Effect Transistor) and a resistive element is formed in an active area of the semiconductor substrate defined by the device isolation area, and a multi-layer wiring structure is formed on the semiconductor substrate. There is also a technique to use a SOI substrate as the semiconductor substrate.

There are disclosed techniques listed below.
[Patent Document 1] Japanese Unexamined Patent Application Publication. No. 2007-242660
[Patent Document 2] Japanese Unexamined Patent Application Publication No. H09-219493

Patent Document 1 and Patent Document 2 disclose a technique relating to a semiconductor device having a resistive element.

SUMMARY

In a semiconductor device having a resistive element formed on the SOI substrate, it is desired to improve the reliability thereof.

Other objects and novel features will become apparent from the description of this specification and the accompanying drawings.

According to an embodiment, a semiconductor device comprises a substrate, a resistive element formed in a first region of the substrate, and a MISFET formed a second region of the substrate. The substrate includes a supporting substrate, an insulating layer on the supporting substrate, and a semiconductor layer on the insulating layer. The resistive element is comprised of the semiconductor layer located in the first region, and first and second semiconductor portions formed on the semiconductor layer located in the first region and spaced apart from each other. The semiconductor layer located in the first region has a first connecting portion on which the first semiconductor portion is formed, a second connecting portion on which the second semiconductor portion is formed, and an element portion located between the first connecting portion and the second connecting portion and on which the epitaxial semiconductor layer is not formed.

According to the embodiment, the reliability of the semiconductor device can be improved.

DETAILED DESCRIPTION

Figure 1:
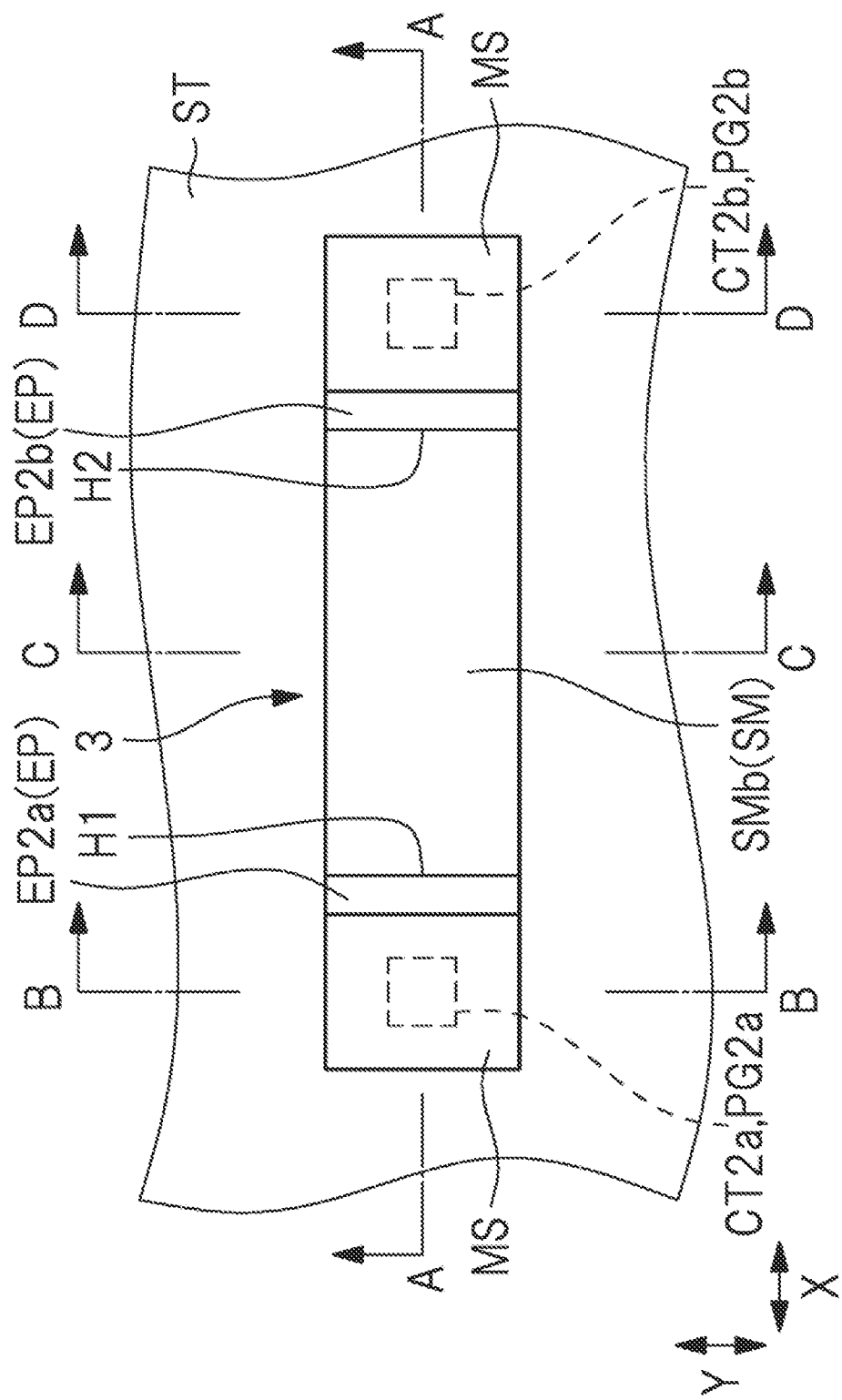
FIG. 1 is a partially enlarged plan view of a semiconductor device of an embodiment.
Figure 2:
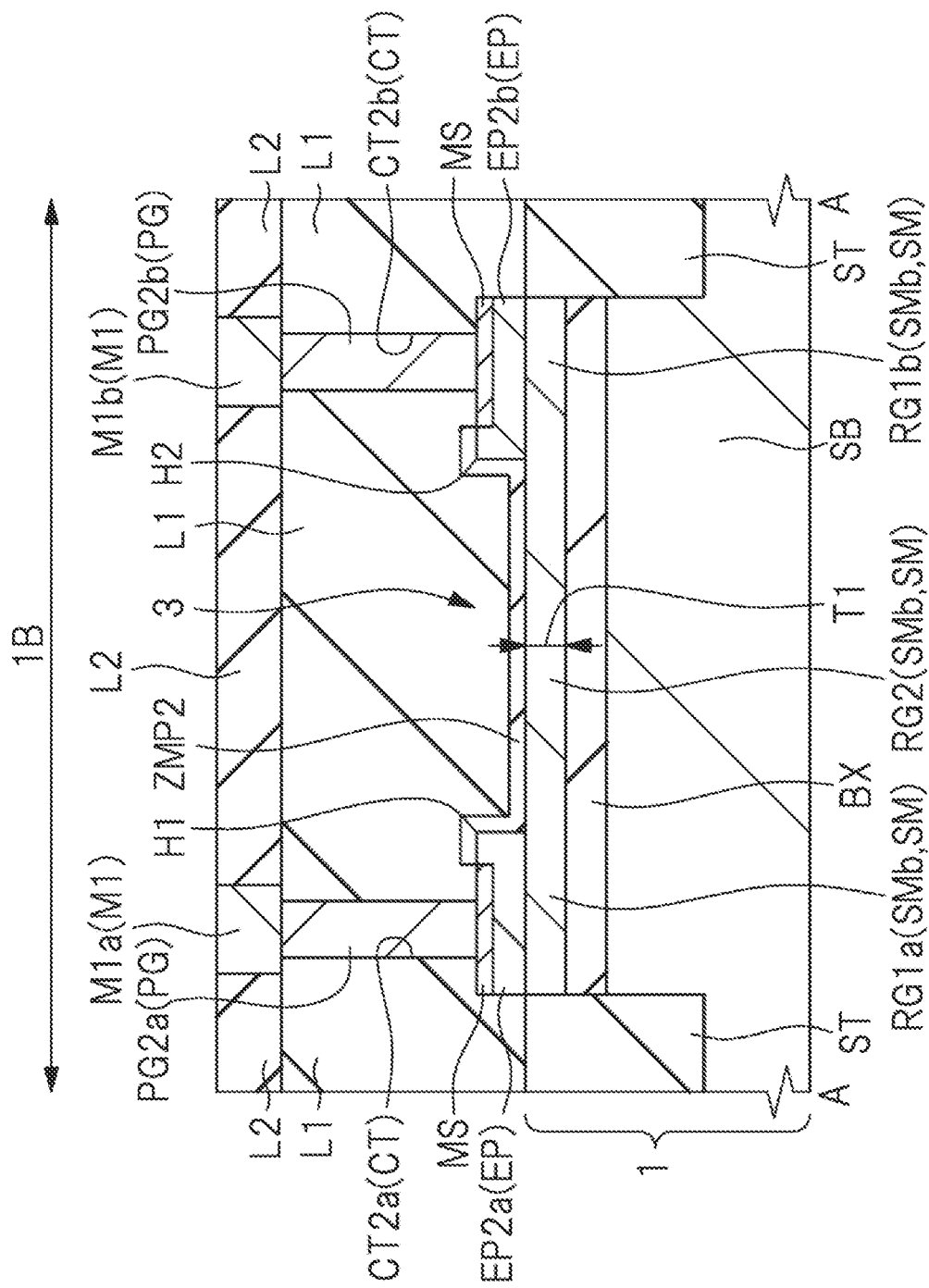
FIG. 2 is a partially enlarged cross-sectional view of the semiconductor device of the embodiment.
Figure 3:
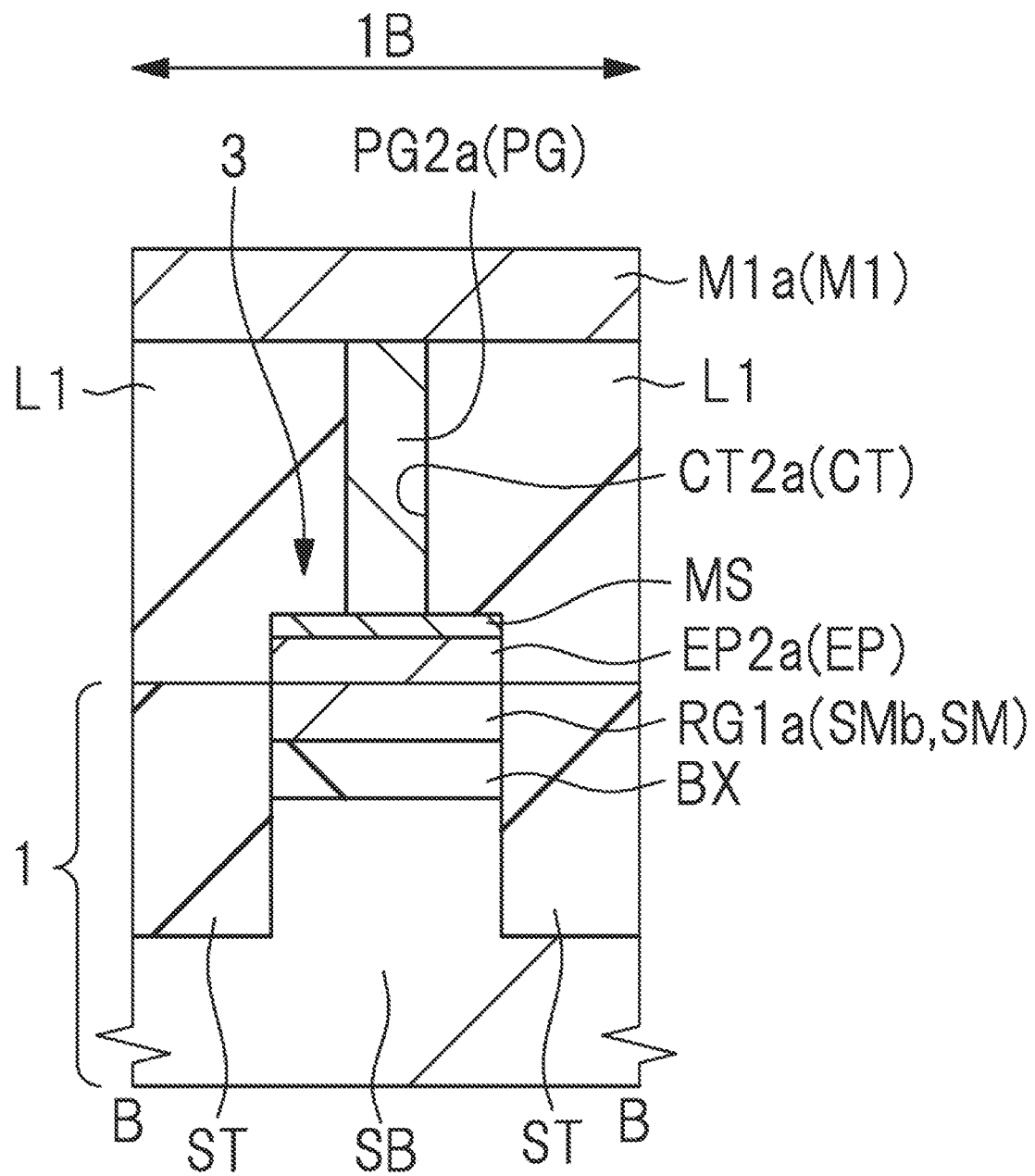
FIG. 3 is a partially enlarged cross-sectional view of the semiconductor device of the embodiment.
Figure 4:
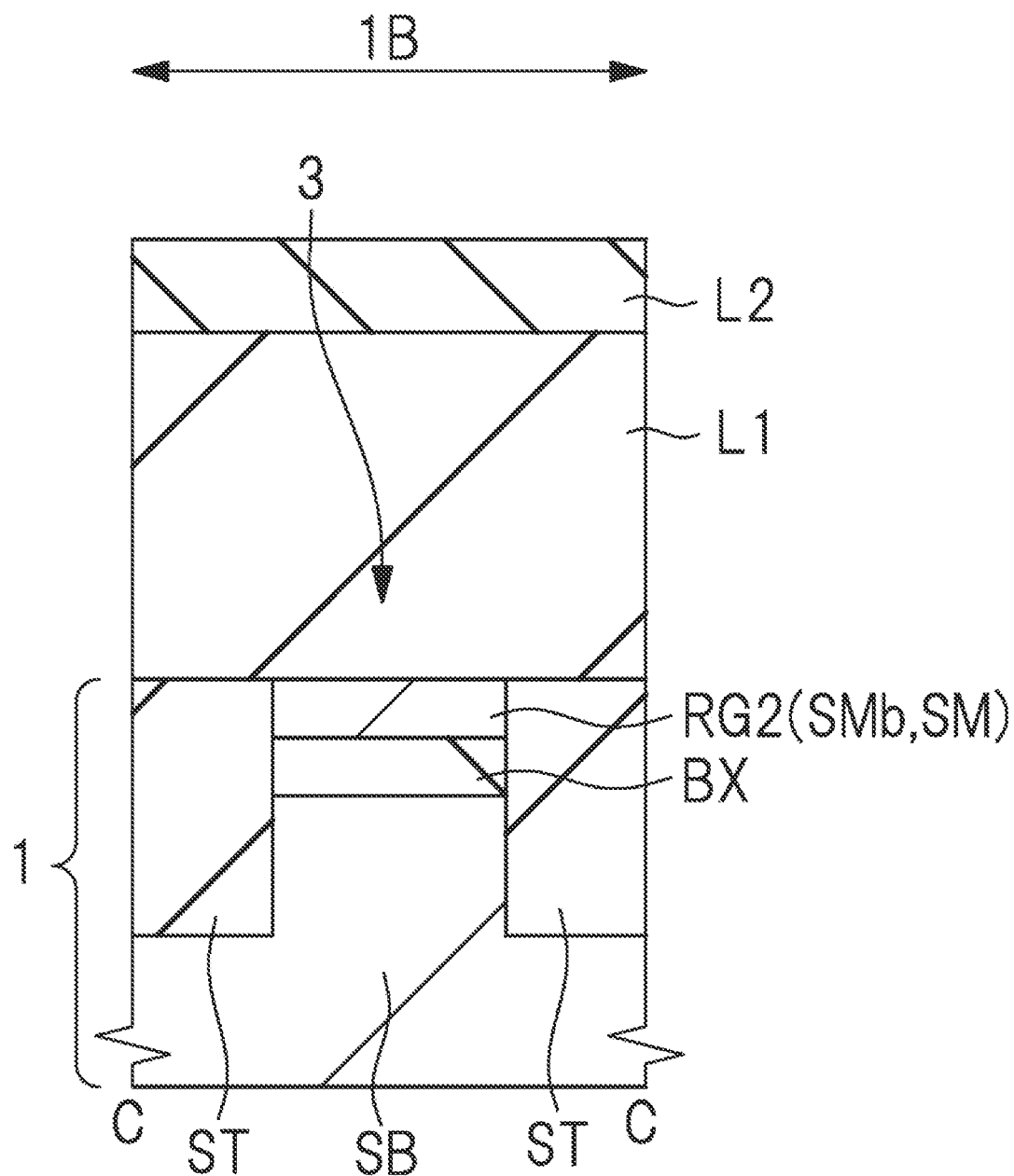
FIG. 4 is a partially enlarged cross-sectional view of the semiconductor device of the embodiment.
Figure 5:
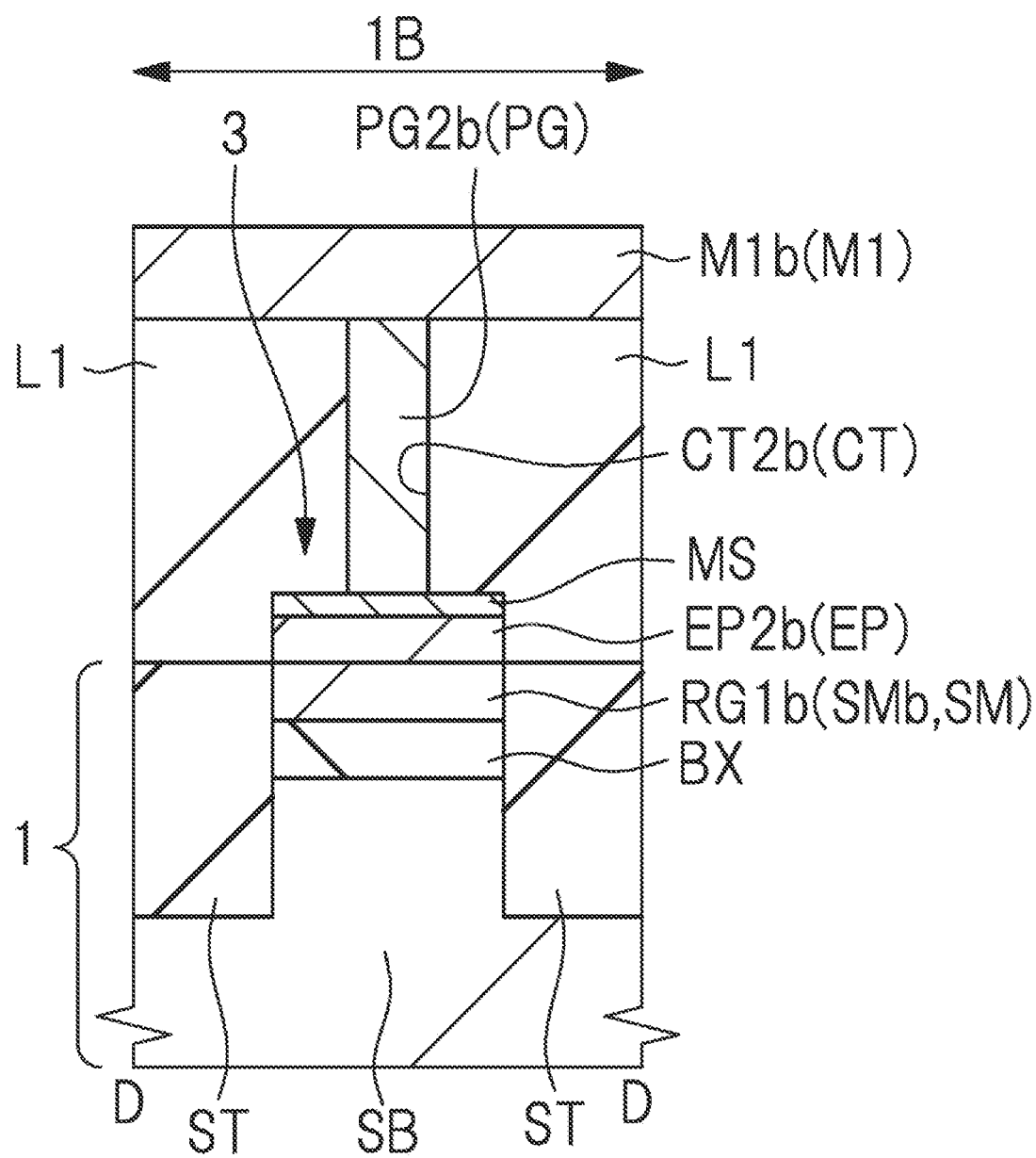
FIG. 5 is a partially enlarged cross-sectional view of the semiconductor device of the embodiment.

In the following embodiments, when required for convenience, the description will be made by dividing into a plurality of sections or embodiments, but except when specifically stated, they are not independent of each other, and one is related to the modified example, detail, supplementary the description, or the like of part or all the other. In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle. Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

Hereinafter, embodiments are described in detail with reference to the drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In the drawings used in the embodiments, hatching may be omitted even in the case of cross-sectional view in order to make the drawings easier to see. Also, even in the case of plan view, hatching may be used to make the drawing easier to see.

Embodiment

<Structure of Semiconductor Device>

A semiconductor device of present embodiment will be described with reference to the drawings. FIG. 1 is a partially enlarged plan view of the semiconductor device of the present embodiment, and FIG. 2 to FIG. 6 are a partially enlarged cross-sectional view of the semiconductor device of the present embodiment. 'A cross-sectional view on A-A line in FIG. 1 almost corresponds to FIG. 2, cross-sectional view on B-B line in FIG. 1 almost corresponds to FIG. 3, 'a cross-sectional view on C-C line in almost corresponds to FIG. 4, and 'a cross-sectional view on D-D line in FIG. 1 almost corresponds to FIG. 5. FIG. 1 to FIG. 5 correspond to each of a plan view and a cross-sectional view of the resistive element forming region 1B in which the resistive element 3 is formed, and FIG. 6 corresponds to a cross-sectional view of a MISFET forming region 1A in which a MISFET 2 is formed. Further, X direction and Y direction shown in FIG. 1 are a direction substantially parallel to the main surface of a SOI substrate, and the X direction and Y direction are perpendicular to each other.

A semiconductor device of the present embodiment shown FIG. 1 to FIG. 6 is the semiconductor device using SOI (SOI: Silicon On insulator) substrate 1.

As shown in FIG. 2 to FIG. 6, the SOI substrate 1 has a chemical (support substrate) SB as support substrate, an insulating layer (buried insulating film) BX formed on the main surface of the semiconductor substrate SB, and a semiconductor layer SM formed on upper surface of the insulating layer BX. The semiconductor substrate SB is the support substrate for supporting the structure above the insulating layer BX and the insulating layer BX is also the semiconductor substrate.

The semiconductor substrate SBs are preferably single crystal silicon substrates, for example made of p-type single crystal silicon. For example, the semiconductor substrate SBs can be formed by single-crystal silicon having a resistivity of about 1 Ωcm to 10 Ωcm. The thickness of the semiconductor substrate SBs may be, for example, about 700 μm to 750 μm. The insulating layer BX is preferably a silicon oxide film, and the thickness of the insulating layer BX can be, for example, about 10 nm to 20 nm. When the insulating layer BX a silicon oxide film, the insulating layer BX can be regarded as a buried oxide film, that is, a BOX (Buried Oxide) layer. The semiconductor layer SM is made of single crystal silicon or the like. For example, the semiconductor layer SM can be formed by single crystal silicon having a specific resistance of about 1 Ωcm to 10 Ωcm. The semiconductor layer SM can also be viewed as an SOI layer. The thickness of the semiconductor layer SM is thinner than the thickness of semiconductor substrate SB is a supporting substrate, the thickness of the semiconductor layer SM may be, for example, about 15 nm to 25 nm. These semiconductor substrate SBs, the insulating layer BX and the semiconductor layer SM, SOI substrate 1 is formed.

As shown in FIG. 2 to FIG. 6, an element isolation region (element isolation structure) ST is formed in the SOI substrate 1. The element isolation region ST is made of an insulating film (e.g., a silicon oxide film) buried in an element isolation groove (trench for element isolation). The element isolation groove and the element isolation region ST filling the element isolation groove penetrate through each of the semiconductor layer SM and the insulating layer BX, and the element isolation region ST has the bottom portion reaching to the middle of the semiconductor substrate SB in a thickness direction. That is, the element isolation region (element isolation structure) ST is formed in such a state that the element isolation region ST is embedded in the element isolation groove formed over the semiconductor layer SM, the insulating layer BX and the semiconductor substrate SB.

The SOI substrate 1 of the present embodiment has the MISFET forming region 1A is a region where a MISFET is formed, and a resistive element forming region 1B is a region where the resistive element is formed. The MISFET forming region 1A and the resistive element forming region 1B corresponds to different planar regions from each other in the main surface of the same SOI substrate 1. The MISFET forming region 1A and the resistance element forming region 1B, respectively, are partitioned by the element isolation region ST, for example, as shown in FIG. 1, surrounded by the respective element isolation region ST. Therefore, the MISFET forming region 1A and the resistive element formation region 1B can be regarded as active regions surrounded by the element isolation region ST, respectively.

The MISFET (Metal Insulator Semiconductor Field Effect Transistor) 2 is formed on the semiconductor layer SM in the MISFET forming region 1A. Further, the semiconductor layer SM of the resistive element forming region 1B, the resistive element. 3 is formed. In the SOI substrate 1, the semiconductor layer SM of the MISFET forming region 1A, and the semiconductor layer SM of the resistive element forming region 1B, respectively, are partitioned surrounded by a plane in the element isolation region ST.

Here, the semiconductor layer SM of the MISFET forming region 1A, referred to as a semiconductor layer SMa with reference numeral SMa, the semiconductor layer SM of the resistive element forming region 1B, referred to as the semiconductor layer SMb with reference numeral SMb. The semiconductor layer SMa and the semiconductor layer SMb has the same thickness to each other.

The semiconductor layer SM of the MISFET forming region 1A, i.e. the semiconductor layer SMa, the side surface is in contact with the element isolation region ST, by the bottom surface is contact with the insulating layer BX, the insulating layer BX and the element isolation region ST has become a state surrounded by. That is, the bottom surface of the semiconductor layer SMa is covered with an insulating layer BX, the side surface of the semiconductor layer SMa is covered with the element isolation region ST. Further, the semiconductor layer SM of the resistance element forming region 1B, the semiconductor layer SMb, the side surface is in contact with the element isolation region ST, by the bottom surface is in contact with the insulating layer BX, it has become a state surrounded by the insulating layer BX and the element isolation region ST. That is, the bottom surface of the semiconductor layer SMb is covered with an insulating layer BX, the side surface of the semiconductor layer SMb is covered with the element isolation region ST. The semiconductor layer SMa and the semiconductor layer SMb are surrounded by the element isolation region ST around in each plan view, therefore, are spaced from each other by the element isolation region ST.

Figure 6:
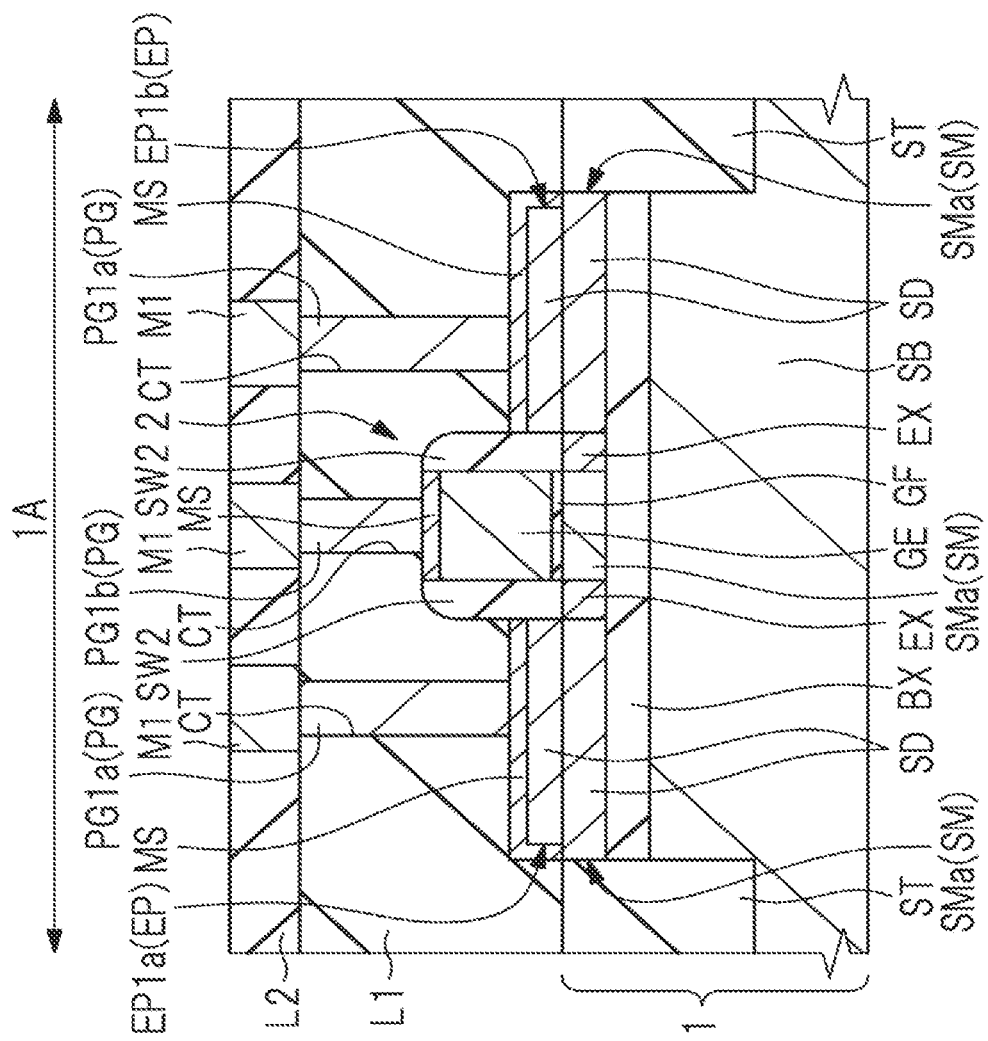
FIG. 6 is a partially enlarged cross-sectional view of the semiconductor device of the embodiment.

First, the MISFET 2 formed in the MISFET forming region 1A will be described (see FIG. 6).

The MISFET2 has a gate electrode GE formed through the gate insulating film GF on the semiconductor layer SMa. Gate electrode GE made of, for example, polycrystalline silicon. On the side wall of the gate electrode GE, sidewall spacer SW2 is formed as a sidewall insulating film.

The semiconductor layer (epitaxial semiconductor) EP is formed on regions, where is located on both sides of the structure comprised of the gate electrode GE and the sidewall spacer SW2, of the semiconductor layer SMa. That the semiconductor layer EP is formed on the region, where is not covered by the gate electrode GE and the sidewall spacer SW2, of the semiconductor layer SMa. The semiconductor layer EP is an epitaxial semiconductor layer formed by epitaxial growth, for example, made of silicon (single crystal silicon).

Here, one of the semiconductor layer EP formed on both sides of the structure comprised of the gate electrode GE and the sidewall spacer SW2, referred to as a semiconductor portion (epitaxial semiconductor portion) EP1a, the other is referred to as a semiconductor portion (epitaxial semiconductor portion) EP1b. That is, the semiconductor layer EP formed on the semiconductor layer SMa has a semiconductor portion EP1a, EP1b formed apart from each other on the semiconductor layer SMa. The semiconductor portion EP1a and the semiconductor portion EP1b, via the gate electrode GE and the sidewall spacer SW2 therebetween, are spaced apart from each other. Therefore, the semiconductor portion EP1a and the semiconductor portion EP1b is made of the same material to each other (here single-crystal silicon), also has the same thickness to each other. Gate electrode GE, in plan view, is disposed between the semiconductor portion EP1a and the semiconductor portion EP1b.

In the MISFET forming region 1A, the source-drain region (semiconductor region for the source or drain) of the MISFET 2 is formed in the semiconductor layers EP, SMa. Specifically, n− type semiconductor region EX formed in the semiconductor layer SMa, and n+ type semiconductor region SD formed in each of the semiconductor layer EP and the semiconductor layer SMa, the source-drain region of the LDD (Lightly Doped Drain) structure is formed. The impurity concentration (n-type impurity concentration) of n+ type semiconductor region SD is higher than the impurity concentration (n-type impurity concentration) of an n− type semiconductor region EX.

In the MISFET forming region 1A, the n− type semiconductor region EX is formed in a region of the semiconductor layer SMa located immediately below the sidewall spacer SW2. In the MISFET forming region 1A, n+ type semiconductor region SD is formed over the semiconductor layer EP and a region of the semiconductor layer SMa located below the semiconductor layer EP. Of the semiconductor layer SMa, the region located directly below the gate electrode GE becomes a channel forming region of the MISFET 2. n− semiconductor region EX is formed on both sides of the channel formation region EX in contact with the channel formation region EX. n+ type semiconductor region SD is adjacent to n− type semiconductor region EX, and n− type semiconductor region EX is interposed between n+ type semiconductor region SD and the channel forming region.

One of the two (one pair) n+ semiconductor regions SD formed on both sides of the gate electrode GE and the sidewall spacer SW2 is a source region composing the MISFET 2, and the other is a drain region composing the MISFET 2. n+ type semiconductor region SD comprising the source region is formed over the semiconductor EP1a and the underlying semiconductor layer SMa, and n+ type semiconductor region SD comprising the drain region is formed over the semiconductor EP1b and the underlying semiconductor layer SMa.

A metal silicide layer (metal compound layer) MS is formed on the surface (upper layer) of the gate electrode GE and n+ semiconductor region SD, respectively. More specifically, the metal suicide layer MS is formed on the surface (upper layer portion) of the semiconductor layer EP (semiconductor portion EP1a, EP1a) composing the n+ type semiconductor region SD.

Next, a resistive element 3 formed in the resistive element forming region 1B will be described (see FIG. 1 to FIG. 5).

The semiconductor layer on the semiconductor layer SMb (epitaxial semiconductor) EP is formed. In the resistive element forming region 1B, the semiconductor layer EP is not formed on the entire semiconductor layer SMb, it is partially formed on the semiconductor layer SMb. Semiconductor layer EP is an epitaxial semiconductor layer formed by epitaxial growth, for example, made of silicon (single crystal silicon).

The semiconductor layer EP formed on the semiconductor layer SMb has a semiconductor portion (epitaxial semiconductor portion) EP2a, EP2b formed apart from each other on the semiconductor layer SMb. Therefore, the semiconductor portion EP2a and the semiconductor portion EP2b is formed by epitaxial growth, made of the same material to each other (here single-crystal silicon), also has the same thickness to each other.

A semiconductor layer EP (semiconductor portion EP2a, EP2b) formed on the resistive element forming region 1B and the semiconductor layer EP (semiconductor portion EP1a, EP1b) formed on the MISFET forming region 1A are formed in the same step (the same epitaxial growth step). Therefore, the semiconductor layer EP formed on the resistive element forming region 1B (semiconductor portion EP2a, EP2b), and the semiconductor layer EP formed on the MISFET forming region 1A (semiconductor portion EP1a, EP1b) is made of the same material to each other (here single crystal silicon), also has the same thickness to each other.

The resistive element 3, the semiconductor layer EP formed on the semiconductor layer SMb and the semiconductor layer SMb (semiconductor portion EP2a, EP2b), it is. If the semiconductor layer SMb, EP is made of silicon, the resistive element 3 can be regarded as a silicon resistive element.

In case of FIG. 1 to FIG. 5, the semiconductor portion EP2a is formed on the semiconductor layer SMb at one end portion in the extending direction (X direction) of the semiconductor layer SMb, the semiconductor portion EP2b is formed on the semiconductor layer SMb at the other end portion in the extending direction (X direction) of the semiconductor layer SMb. The semiconductor portion EP2a and the semiconductor portion EP2b are separated from each other.

The semiconductor layer SMb has a region (connecting portion, end portion) RG1a located directly below the semiconductor portion EP2a, a region (connecting portion, end portion) RG1b located directly below the semiconductor portion EP2b, and a region (element portion, central portion) RG2 located between the region RG1a and the region RG1b and on which the semiconductor layer EP is not formed. The semiconductor portion EP2a is formed on the region RG1a of the semiconductor layer SMb, the semiconductor portion EP2b is formed on the region RG1b of the semiconductor layer SMb, but the semiconductor layer EP is not formed on the region RG2 of the semiconductor layer SMb. The region RG1a can also be regarded as a region, on which the semiconductor portion EP2a is formed, of the semiconductor layer SMb. Also, the region RG1b can also be regarded as a region, on which the semiconductor portion EP2b is formed, of the semiconductor layer SMb. Further, the region RG2 can be regarded as a region, on which the semiconducting layer EP is not formed, of the semiconductor layer SMb.

A metal silicide layer (metal compound layer) MS is formed on each of surfaces (upper layer portions) of the semiconductor portion EP2a and the semiconductor portion EP2b. The surface of the semiconductor layer SMb, which corresponds to the metal silicide layer MS is not formed. Of the semiconductor layer SMb, the surface (upper surface) of the region RG2 not covered with the semiconductor layer EP (semiconductor portion EP2a, EP2b) is covered with an insulating film pattern (patterned insulating film) ZMP2. Also, among the respective surfaces of the semiconductor portion EP2a, EP2b (upper surface), the region where the metal silicide layer MS is not formed is also covered with the insulating film patterned ZMP2. Further, the insulating film pattern ZMP2 on the surface of the semiconductor layer SMb located in the region RG2, so that the insulating film pattern ZMP2 on the surface of each semiconductor portion EP2a, EP2b is integrally connected, insulating film pattern ZMP2 is also formed on the side surface of each semiconductor portion EP2a, EP2b (side surfaces facing each other). For this reason, the metal silicide layer MS formed in regions of the surfaces of the respective semiconductor portions EP2a, EP2b that are not covered with the insulating film pattern ZMP2, and the insulating film pattern ZMP2 is a film that functions as a silicide blocking layer for preventing the formation of the metal silicide layer MS.

An insulating film (interlayer insulating film) L1 is formed on the main surface of the SOI substrate 1 so as to cover the gate electrode GE, the sidewall spacer SW2, the semiconductor layer SM, EP, and the metal silicide layer MS, as an interlayer insulating film. A contact hole (through hole, hole) CT penetrating through the insulating film L1 is formed in the insulating film L1, and a conductive plug (contact plug) PG is formed (embedded) in the contact hole CT. The plurality of plugs PG is formed, and the plurality of plugs PG includes the plug PG connected to the gate electrode GE, the plug PG connected to n+ semiconductor region SD, the plug PG connected to the semiconductor portion EP2a, and the plug PG connected to the semiconductor portions EP2b. The bottom surface of each plug PG is in contact with the metal silicide layer MS.

Here, the plug PG that as arranged on n+ type semiconductor region SD and that is electrically connected to n+ type semiconductor region SD refers as a plug PG1a. Further, the plug PG that is arranged on the gate electrode GE and that is electrically connected to the gate electrode GE refers as a plug PG1b. Further, the plug PG that is arranged on the semiconductor portion EP2a and that is electrically connected to the semiconductor portion EP2a refers as a plug PG2a. Further, the plug PG that is arranged on the semiconductor portion EP2b and that is electrically connected to the semiconductor portion EP2b refers as a plug PG2b. The contact hole CT having the embedded plug PG2a refers as a contact hole CT2a, and the contact hole CT having the embedded plug PG2b refers as a contact hole CT2b.

The plug PG1a is in contact with the metal silicide layer MS formed on the surface (upper layer portion) of n+ type semiconductor region SD, and is electrically connected to n+ type semiconductor region SD via the metal silicide layer MS. Further, the plug PG1b is in contact with the metal silicide layer MS formed on the surface of the gate electrode GE (upper layer portion), it is electrically connected to the gate electrode GE via the metal silicide layer MS. Further, the plug PG2a is in contact with the metal silicide layer MS formed on the surface of the semiconductor portion EP2a (upper layer portion), and is electrically connected to the semiconductor portion EP2a through the metal silicide layer MS. Further, the plug PG2b is in contact with the metal silicide layer MS formed on the surface of the semiconductor portion EP2b (upper layer portion), and is electrically connected to the semiconductor portion EP2b through the metal silicide layer MS.

On the insulating film L1 the plug PG is embedded, an insulating film L2 is formed, the groove formed in the insulating film L2 (wiring groove), a wiring M1 is formed (embedded). The wires M1 are electrically connected to n+ semiconductor regions SD, the gate electrodes GE, the semiconductor portions EP2a, the semiconductor portions EP2b, and the like via the plug PG.

Here, the wiring M1 connected to the plug PG2a refers as a wiring M1a. Further, the wiring M1 connected to the PG2 refers as a wiring M1b. The wire M1a is in contact with the plug PG2a of the upper surface, and is electrically connected to the plug PG2a. Further, the wire M1b is in contact with the plug PG2*b* of the upper surface, and is electrically connected to the plug PG2*b*. Therefore, the wiring M1*a* is electrically connected to the metal silicide layer MS of the surface of the semiconductor portion EP2*a* via the plug PG2*a*, and is further electrically connected to the semiconductor portion EP2*a* via the metal silicide layer MS. Further, the wiring M1*b* is electrically connected to the metal silicide layer MS of the surface of the semiconductor portion EP2*b* via the plug PG2*b*, and is further electrically connected to the semiconductor portion EP2*b* via the metal silicide layer MS.

Although the wiring located in an upper layer than the wiring M1 is formed, the structure above the insulating film L2 and the wiring M1 will not be shown and be described.

The resistive element 3 includes a semiconductor layer SM of the resistive element forming region 1B (i.e., semiconductor layer SMb), the semiconductor layer EP formed on the semiconductor layer SMb (specifically semiconductor portion EP2*a*, EP2*b*), it is formed. From the wiring M1*a*, through the plug PG2*a*, a predetermined potential (voltage) is applied to the metal silicide layer MS of the surface of the semiconductor portion EP2*a*, also, from the wiring M1*b*, through the plug PG2*b*, a predetermined potential (voltage) is applied to the metal silicide layer MS of the surface of the semiconductor portion EP2*b*. When there is a difference between the potential of the wiring M1*a* (voltage) and the potential of the wiring M1*b* (voltage), i.e., when there is a difference between the potential of the plug PG2*a* (voltage) and the potential of the plug PG2*b* (voltage), a current flows through the resistive element 3. For example, if the potential of the wiring M1*a* (voltage) is higher than the potential of the wiring M1*b* (voltage), a high potential (high voltage) is applied to the metal silicide layer MS of the surface of the semiconductor portion EP2*a* from the plug PG2*a*, the metal silicide layer MS of the surface of the semiconductor portion EP2*b* from the plug PG2*b* low potential (low voltage) is applied. As a consequence, the current flows from the plug PG2*a* to the plug PG2*b* through the metal silicide layer MS on the surface of the semiconductor portion EP2*a*, the semiconductor portion EP2*a*, the semiconductor layer SMb located in the region RG1*a*, the semiconductor layer SMb located in the region RG2, the semiconductor layer SMb located in the region RG1*b*, the semiconductor portion EP2*b*, and the metal silicide layer MS on the surface of the semiconductor portion EP2*b*. Further, if the potential (voltage) of the wiring M1*b* is higher than the potential (voltage) of the wiring M1*a*, a high potential (high voltage) is applied to the metal silicide layer MS of the surface of the semiconductor portion EP2*b* from the plug PG2*b*, while a low potential (low voltage) is applied to the metal silicide layer MS of the surface of the semiconductor portion EP2*a* from the plug PG2*a*. As a consequence, the current flows from the plug PG2*b* to the plug PG2*a* through the metal silicide layer MS on the surface of the semiconductor portion EP2*b*, the semiconductor portion EP2*b*, the semiconductor layer SMb located in the region RG1*b*, the semiconductor layer SMb located in the region RG2, the semiconductor layer SMb located in the region RG1*a*, the semiconductor portion EP2*a*, and the metal silicide layer MS on the surface of the semiconductor portion EP2*a*.

Mainly determining the resistance of the resistive element 3 is the region RG2 of the semiconductor layer SMb. Because, the region RG2 of the semiconductor layer SMb, since the thickness is thin, in the region RG2 of the semiconductor layer SMb, because the region of the cross section substantially perpendicular to the direction in which the current flows is reduced. By reducing the thickness of the regional RG2 of the semiconductor layer SMb, it is possible to increase the resistance of the resistive element 3. The resistance value of the resistive element 3 is also defined by the impurity concentration in the region RG2 of the semiconductor layer SMb, by reducing the impurity concentration in the region RG2 of the semiconductor layer SMb, the resistance value of the resistive element 3 is increased, also, by increasing the impurity concentration in the region RG2 of the semiconductor layer SMb, the resistance value of the resistive element 3 is reduced.

Figure 7:
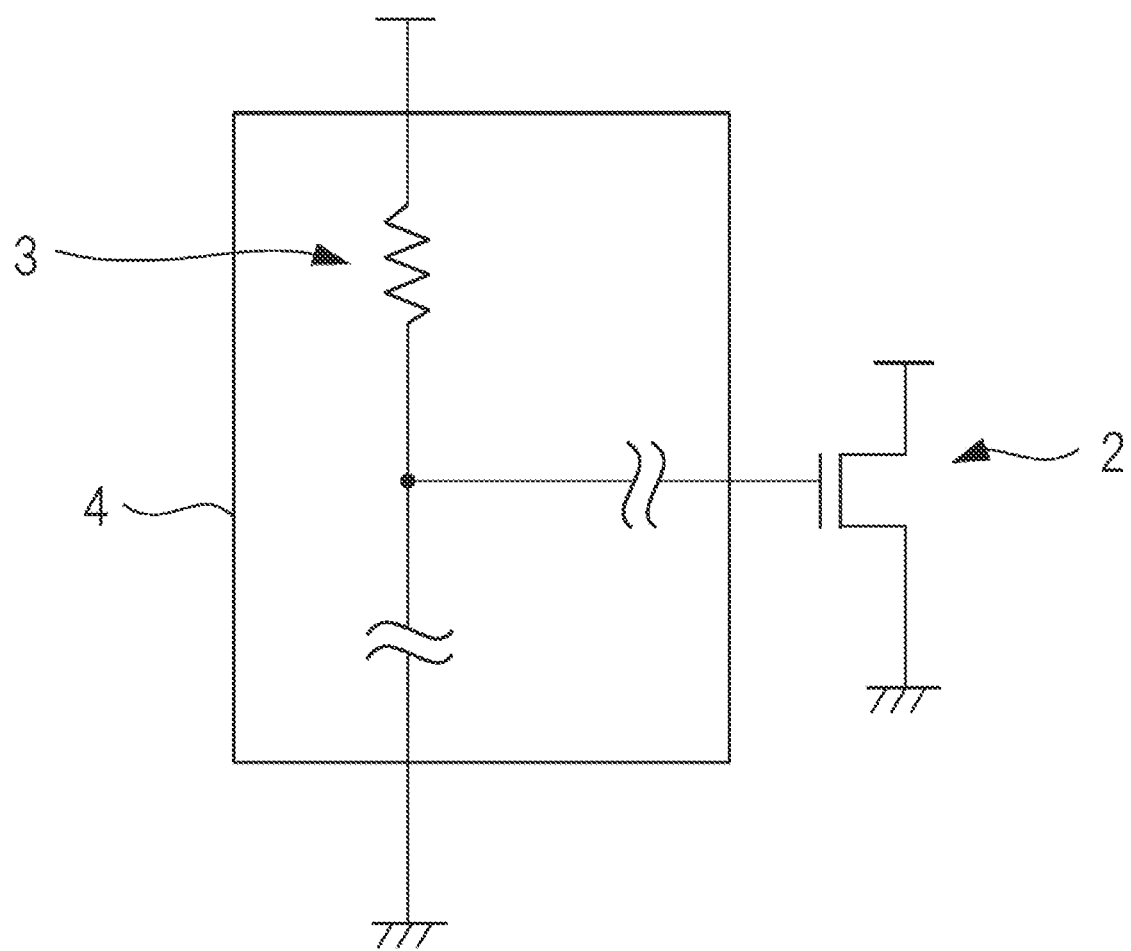
FIG. 7 is a circuit diagram showing an exemplary circuit included in the semiconductor device of the embodiment.

FIG. 7 is a circuit diagram showing a circuit example included in a semiconductor device of the present embodiment.

The resistive element 3 can be utilized in various circuits, if FIG. 7, as a component of the bias current generating portion 4, using a resistive element 3. The MISFET 2 can also be utilized in various circuitry, but in case of FIG. 7, the MISFET 2 is connected to the bias current generating portion 4.

<Method of Manufacturing Semiconductor Device>

The method of manufacturing a semiconductor device of the present embodiment will be described with reference to the drawings. FIG. 8 to FIG. 25 are a partially enlarged cross-sectional view during a method of manufacturing the semiconductor device of the present embodiment. In each of FIG. 8 to FIG. 25, a cross-section corresponding to the above FIG. 6 (a cross section of the MISFET forming region 1A) and a cross-section corresponding to the above FIG. 2 (a cross section of the resistive element forming region 1B) are shown.

Figure 8:
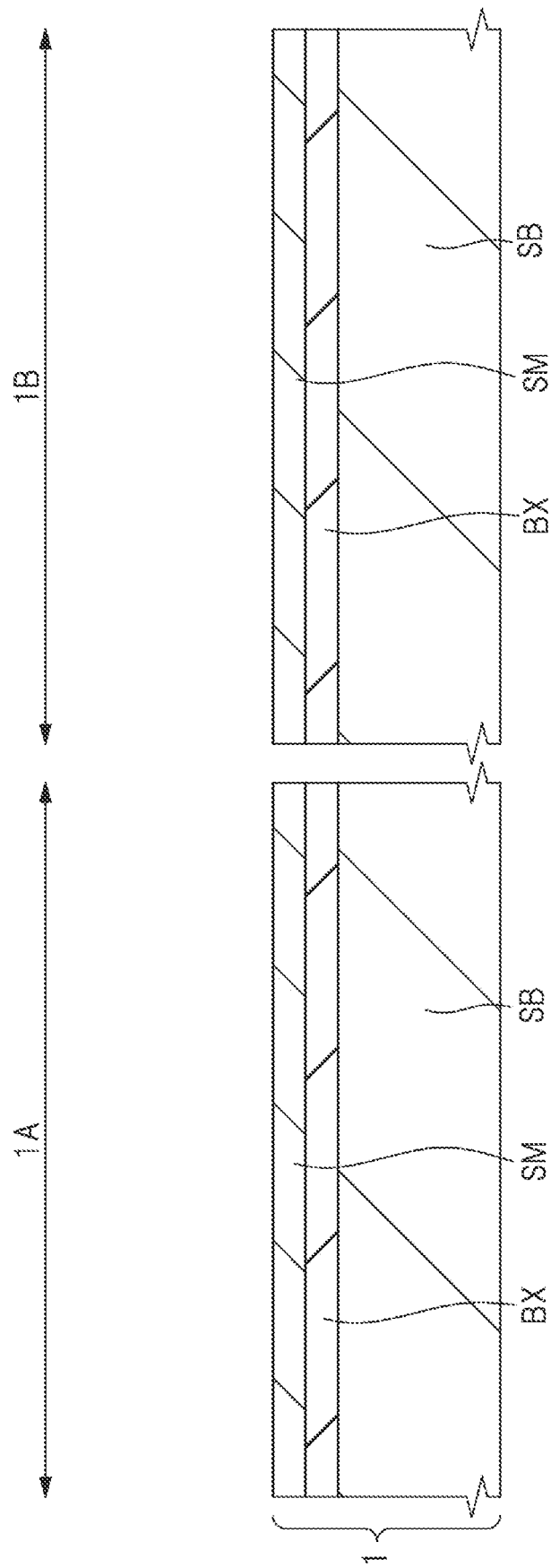
FIG. 8 is a partially enlarged cross-sectional view during a method of manufacturing the semiconductor device of the embodiment.

First, as shown in FIG. 8, an SOI substrate 1 is prepared. As can be seen from FIG. 8, the SOI substrate 1 includes a semiconductor substrate SB as a support substrate, an insulating layer BX formed on the main surface of the semiconductor substrate SB, a semiconductor layer SM formed on upper surface of the insulating layer BX, and a.

Although the method of manufacturing the SOI substrate 1 is not limited, the SOI substrate 1 can be manufactured by, for example, a SIMOX (Silicon Implanted Oxide method, a bonding method, a smart cut process, or the like.

Figure 9:
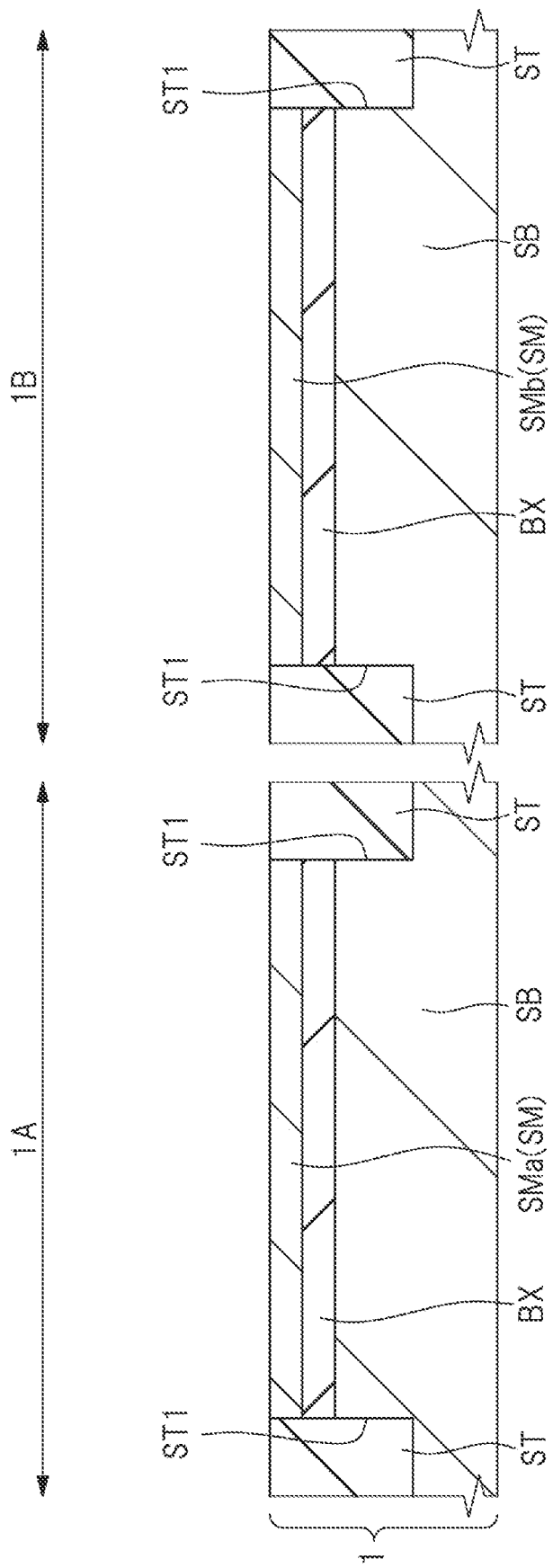
FIG. 9 is the partially enlarged cross-sectional view during the method of manufacturing the semiconductor device following FIG. 8.

Next, as shown in FIG. 9, the element isolation region ST is formed in the SOI substrate 1.

In order to form the element isolation region ST, for example, the element isolation groove ST1 that penetrates through each of the semiconductor layer SM and the insulating layer BX and that has the bottom portion reaches the substrate SB is formed on the main surface of the SOI substrate 1 (semiconductor layer SM) by using a photolithography technique and a dry etching technique or the like. Since the element isolation groove ST1 penetrates through each of the semiconductor layer SM and the insulating layer BX so as to have the bottom portion reaching to the substrate SB (namely, the bottom portion of the element isolation groove ST1 is locate in the middle of the substrate SB in the thickness direction thereof), the substrate SB is exposed at the bottom portion of the element isolation groove ST1. Then, the element isolation region ST can be formed by embedding an insulating film in the element isolation groove ST1 by using a film forming technique and a CMP technique or the like. For example, the element isolation region ST made of the insulating film embedded in the element isolation groove ST1 is formed on the main surface of the SOI substrate 1 by forming the insulating film such that the element isolation groove ST1 is buried with the insulating film and removing the insulating film outside the element isolation groove ST1 by using a CMP (Chemical Mechanical Polishing) method or the like.

In the SOI substrate 1, by forming the element isolation region ST, the semiconductor layer SM is divided into a plurality of sections (i.e., active region), and the semiconductor layer SM composing the respective active regions is surrounded by the element isolation region ST. The semiconductor layer SM located in the MISFET forming region 1A is a semiconductor layer SMa, and the semiconductor layer SM located the resistive element forming region 1B is a semiconductor layer SMb. The bottom surface of each semiconductor layer SMa, SMb in contact with the insulating layer BX. Also, the side surface of each semiconductor layer SMa, SMb is contact with the element isolation region ST.

Figure 10:
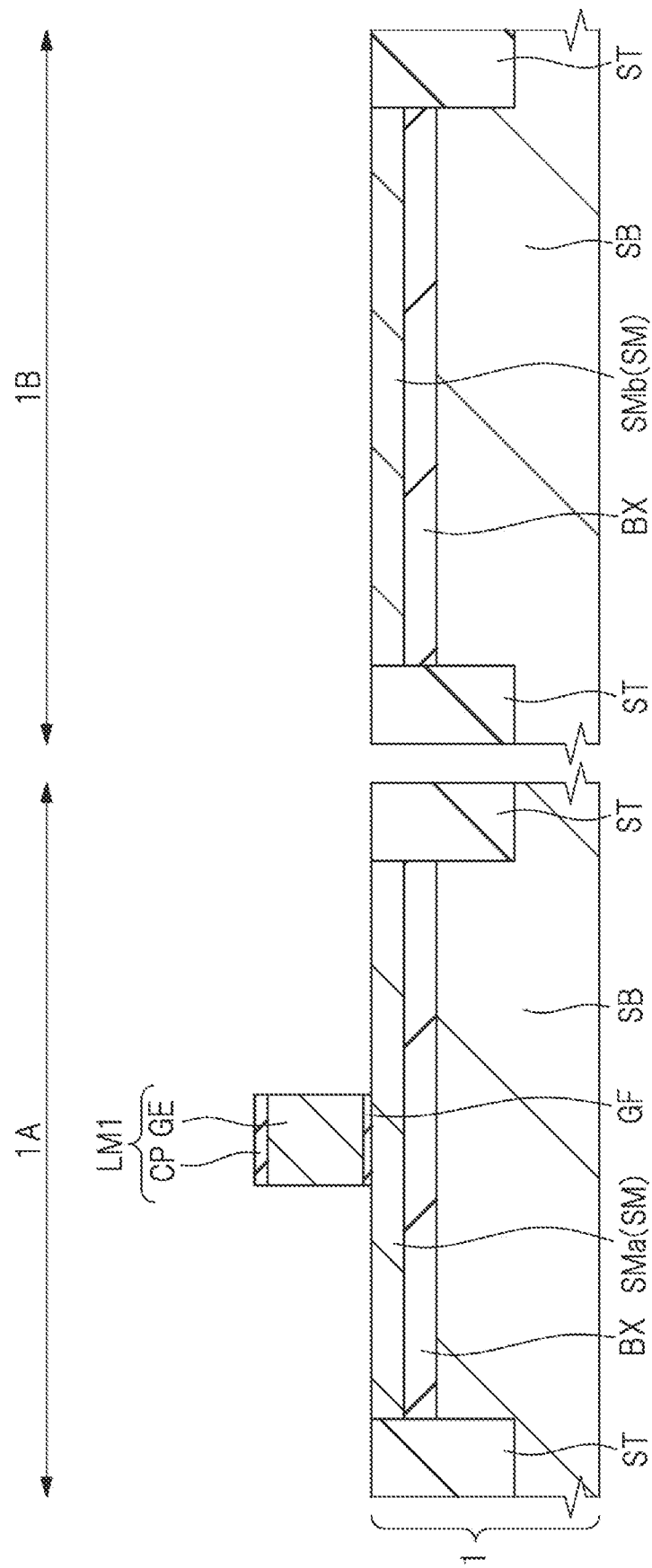
FIG. 10 the partially enlarged cross-sectional view during the method of manufacturing the semiconductor device following FIG. 9.

Next, as shown in FIG. 10, in the MISFET forming region 1A, on the main surface of the SOI substrate 1, i.e. on the main surface of the semiconductor layer SM (SMa), form a gate electrode GE through the gate insulating film GF. The upper portion of the gate electrode GE, an insulating film having the same planar shape as the gate electrode GE (cap insulating film) CP may be formed. The thickness of the gate electrode GE of the present embodiment is, for example, 100 nm.

Specific examples of the gate insulating film GF and the gate electrode GE forming step will be described. First, on the main surface of the SOI substrate 1, i.e. on the main surface of the semiconductor layer SM, after forming an insulating film for the gate insulating film GF, a conductive film for the gate electrode GE on the insulating film (e.g., polysilicon film) to form the insulating film on the conductive film (the insulating film that becomes an insulating film CP later). In this stage, the laminated film of the conductive film for the gate electrode GE and the insulating film thereon is formed on both the MISFET forming region 1A and the resistive element forming region 1B. Then, by patterning the laminated film of the conductive film for the gate electrode GE and the insulating film thereon using a photolithography technique and etching technique, is possible to form a gate electrode GE made of a patterned conductive film. Gate electrode GE is formed in the MISFET forming region 1A, between the gate electrode GE and the semiconductor layer SM, the insulating film for the gate insulating film GF remains, which is a gate insulating film GF. Further, the gate electrode GE, a state in which the insulating film CP is patterned in substantially the same plane shape as the gate electrode GE is formed. In the resistive element forming region 1B, the entire laminated film of the conductive film and the insulating film thereon for the gate electrode GE is removed. Further, among the insulating film for the gate insulating film GF, other than the portion covered with the gate electrode GE, or dry etching performed in the patterning process of the conductive film for the gate electrode GE, or wet etching after its dry etching it can be removed by performing. Thus, the gate insulating film GF and the gate electrode GE, in the SOI substrate 1, but is formed in the MISFET forming region 1A, the resistive element forming region 1B, a state that is not formed.

In the following, the laminate of the gate insulating film GF formed on the MISFET forming region 1A and the gate electrode GE thereon and the insulating film CP thereon, referred to as a laminated body LM1.

Figure 11:
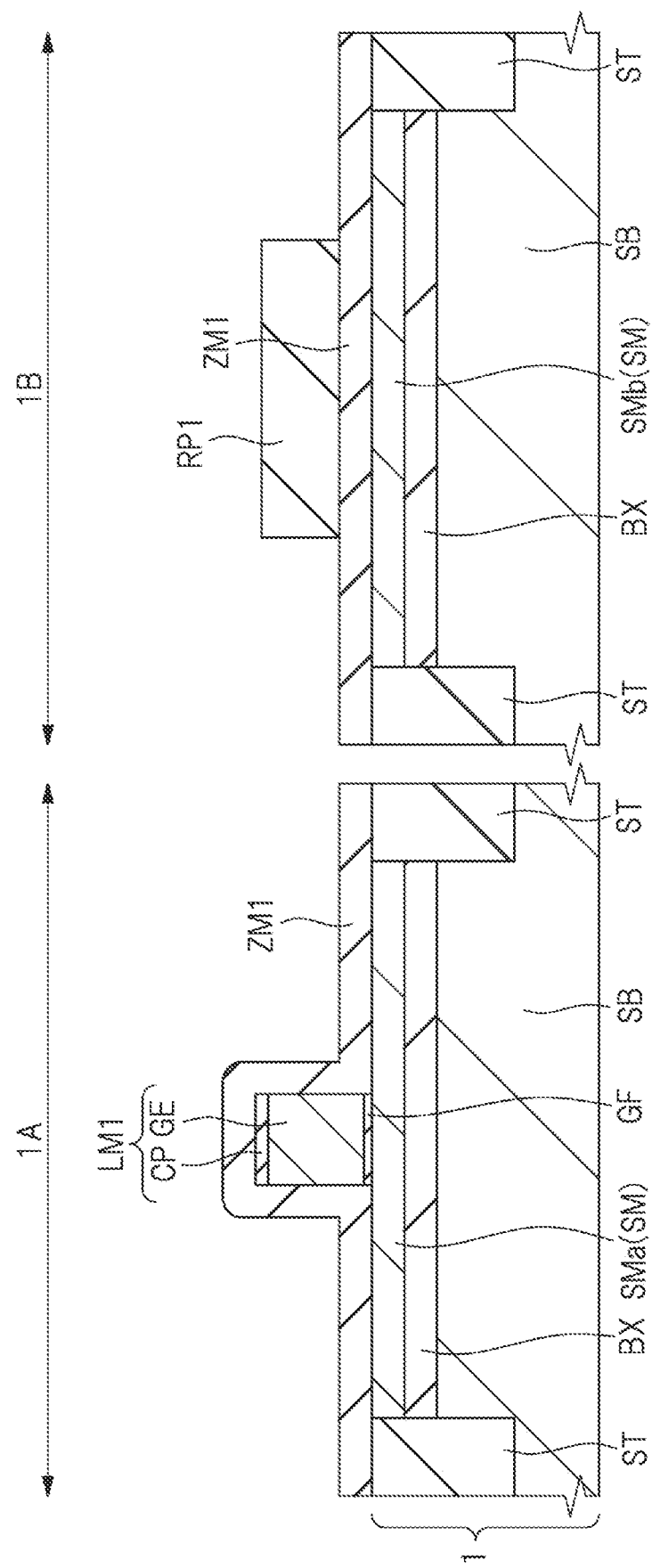
FIG. 11 is the partially enlarged cross-sectional view during the method of manufacturing the semiconductor device following FIG. 10.

Next, as shown in FIG. 11, on the main surface of the SOI substrate 1, i.e. on the main surface of the semiconductor layer SM, so as to cover the laminated body LM1, to form an insulating film ZM1. The insulating film ZM1 is formed of, for example, a silicon oxide film, and can be formed by a CVD (Chemical Vapor Deposition) method or the like. Here, the insulating film ZM1 will be described when a single insulating film, as another form, the insulating film ZM1, can also be a laminated insulating film obtained by laminating a plurality of insulating films.

Next, as shown in FIG. 11, a photoresist pattern RP1 is formed on the insulating film ZM1 using a photolithography technique. The photoresist pattern RP1 is formed on the resistive element forming region 1B is not formed on the MISFET forming region 1A.

Figure 12:
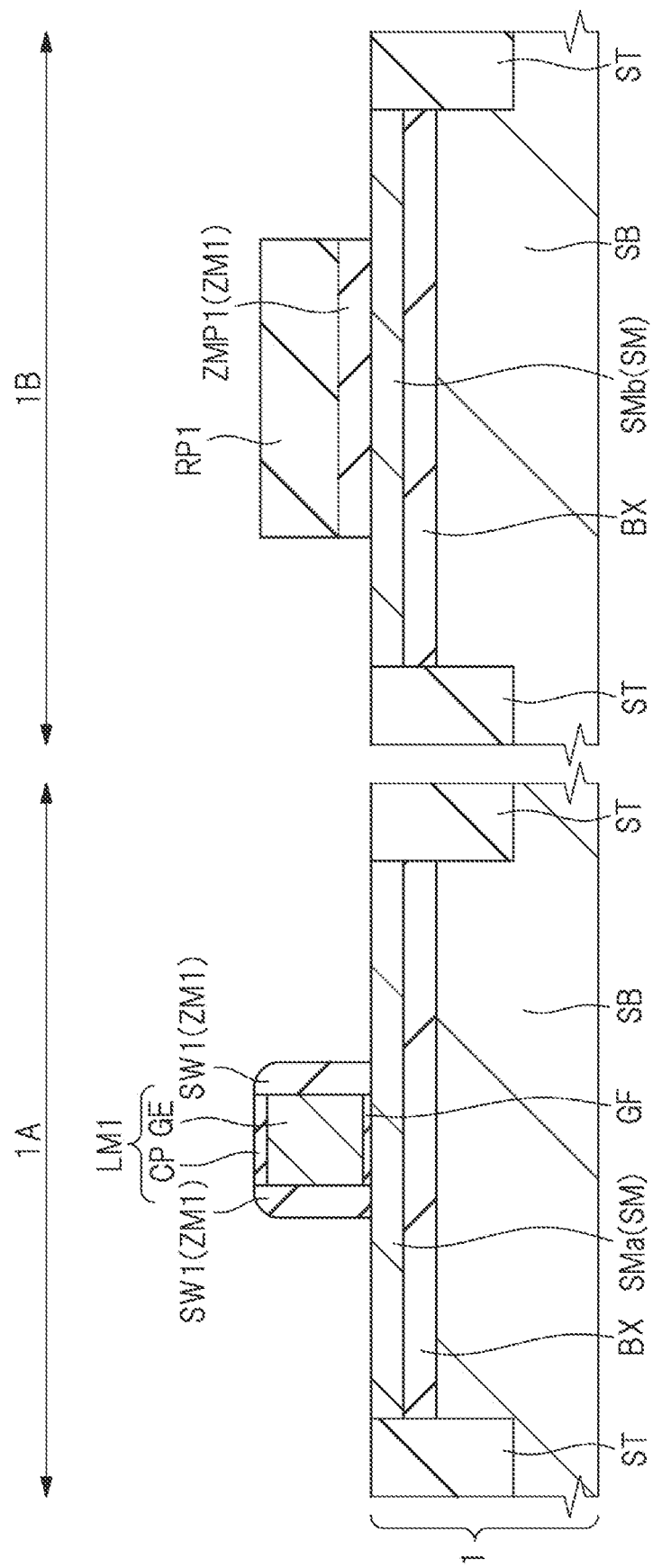
FIG. 12 is the partially enlarged cross-sectional view during the method of manufacturing the semiconductor device following FIG. 11.
Figure 13:
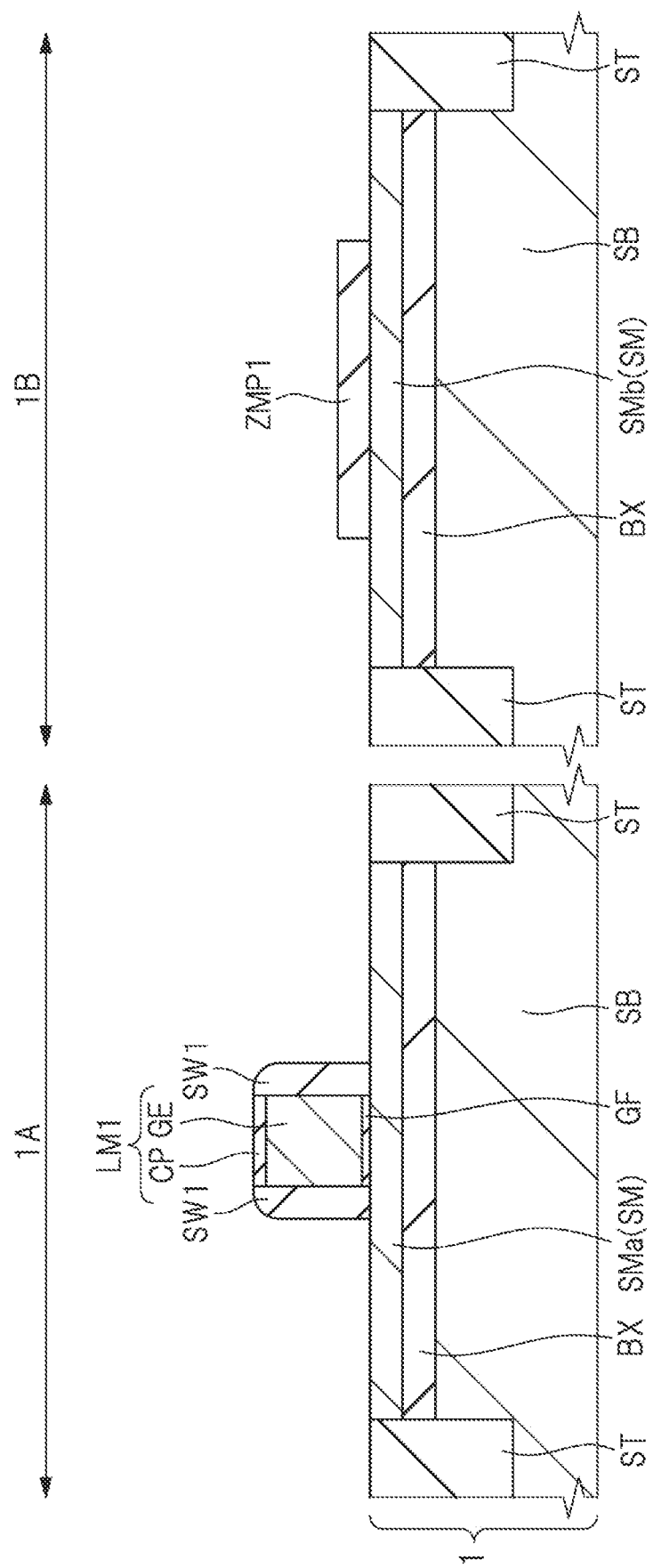
FIG. 13 is the partially enlarged cross-sectional view during the method of manufacturing the semiconductor device following FIG. 12.

The insulating film ZM1 is then etched back using an anisotropic etching technique. By this etch-back process, as shown in FIG. 12, in the MISFET forming region 1A, the insulating film ZM1 remains on the side wall of the laminate body LM1 as a sidewall spacer (sidewall insulating film) SW1. Also, in the resistive element forming region 1B, the insulating film ZM1 remains below the photoresist pattern RP1 as an insulating film pattern (patterned insulating film) ZMP1. In the meantime, other insulating film ZM1 is removed. Thereafter, as shown in FIG. 13, the photoresist pattern RP1 is removed by ashing or the like.

In this way, in the MISFET forming region 1A, the sidewall spacer (the sidewall insulating film) SW1 is formed on the sidewall of the laminated body LM1, in the resistive element forming region 1B, the insulating film pattern ZMP1 is formed on the semiconductor layer SM. In the resistive element forming region 1B, the semiconductor layer SM has a portion covered with the insulating film pattern ZMP1, and a portion not covered with the insulating film pattern ZMP1.

Figure 14:
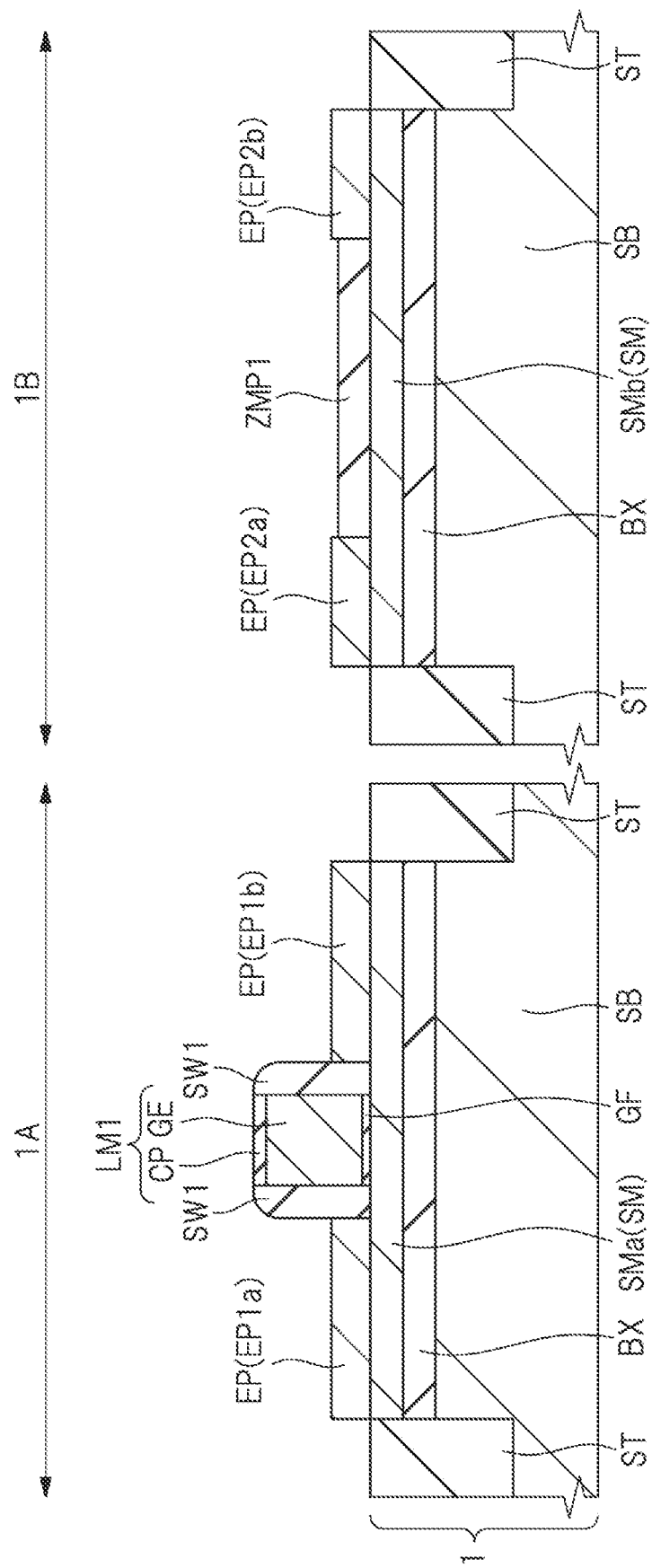
FIG. 14 is the partially enlarged cross-sectional view during the method of manufacturing the semiconductor device following FIG. 13.

Next, as shown in FIG. 14, by epitaxial growth method, to form a semiconductor layer (epitaxial layer) EP. Semiconductor layer EP is formed on the exposed surface of the semiconductor layer SM. In the MISFET forming region 1A, the semiconductor layer EP is formed on a portion not covered by the laminated body LM1 and the sidewall spacer SW1 of the semiconductor layer SMa. That is, in the MISFET forming region 1A, the semiconductor layer EP, is formed on a region, located on both sides of the structure comprised of the laminated body LM1 and the sidewall spacer SW1 formed on the side wall of the laminated body LM1, of the semiconductor layer SMa. Further, in the resistive element forming region 1B, the semiconductor layer EP is formed on a portion not covered with the insulating film pattern ZMP1 of the semiconductor layer SMb. Semiconductor layer EP is made of, for example, silicon (single crystal silicon). As described above, the semiconductor layer EP has a semiconductor portion EP1a, EP1b formed on the MISFET forming region 1A, and a semiconductor portion EP2a, EP2b formed on the resistive element forming region 1B.

Figure 15:
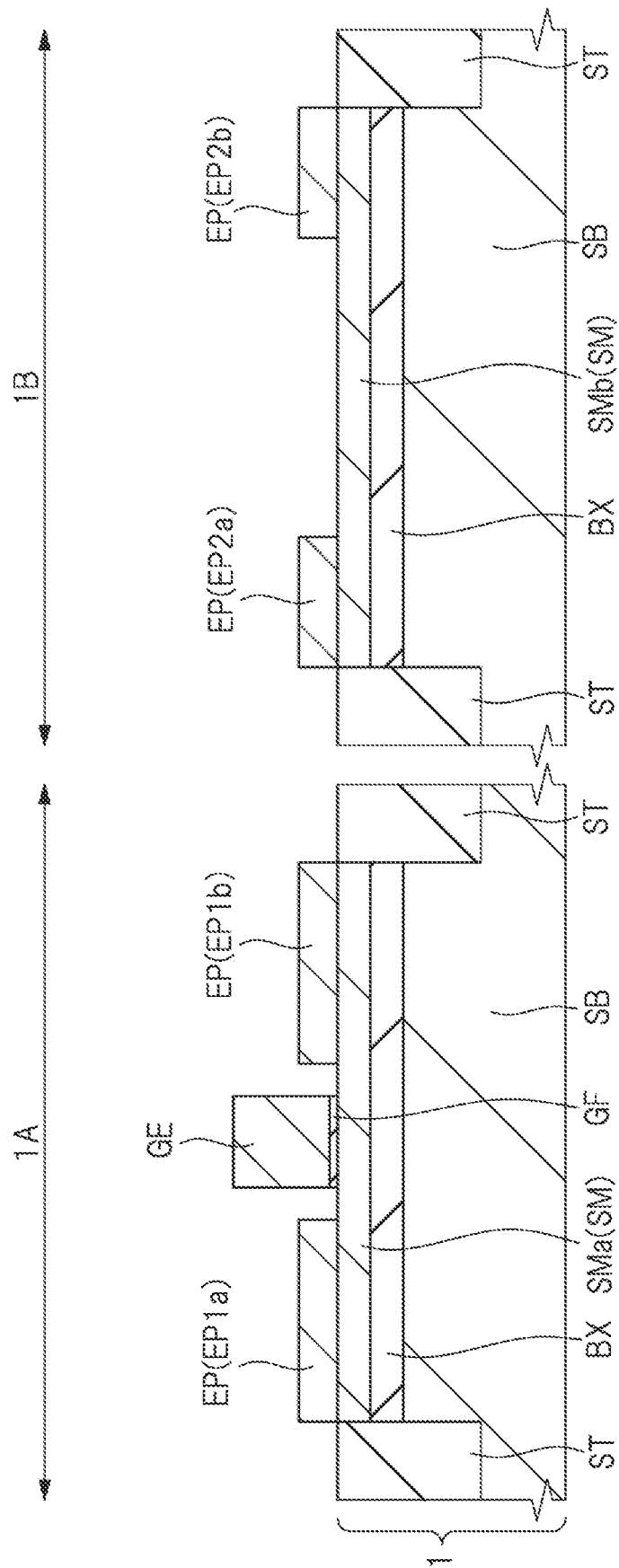
FIG. 15 is the partially enlarged cross-sectional view during the method of manufacturing the semiconductor device following FIG. 14.

The sidewall spacer SW1 and the insulator patterned ZMP1 are then etched away as shown in FIG. 15. During this etching, it is also possible to remove the insulating film CP on the gate electrode GE. Further, in this etching, as compared with the sidewall spacer SW1 and the insulating film pattern ZMP1, the semiconductor layer EP, SM and the gate electrode GE by performing etching under difficult conditions to be etched, the semiconductor layer EP, SM and the gate electrode GE is etched, it is possible to suppress or prevent.

Figure 16:
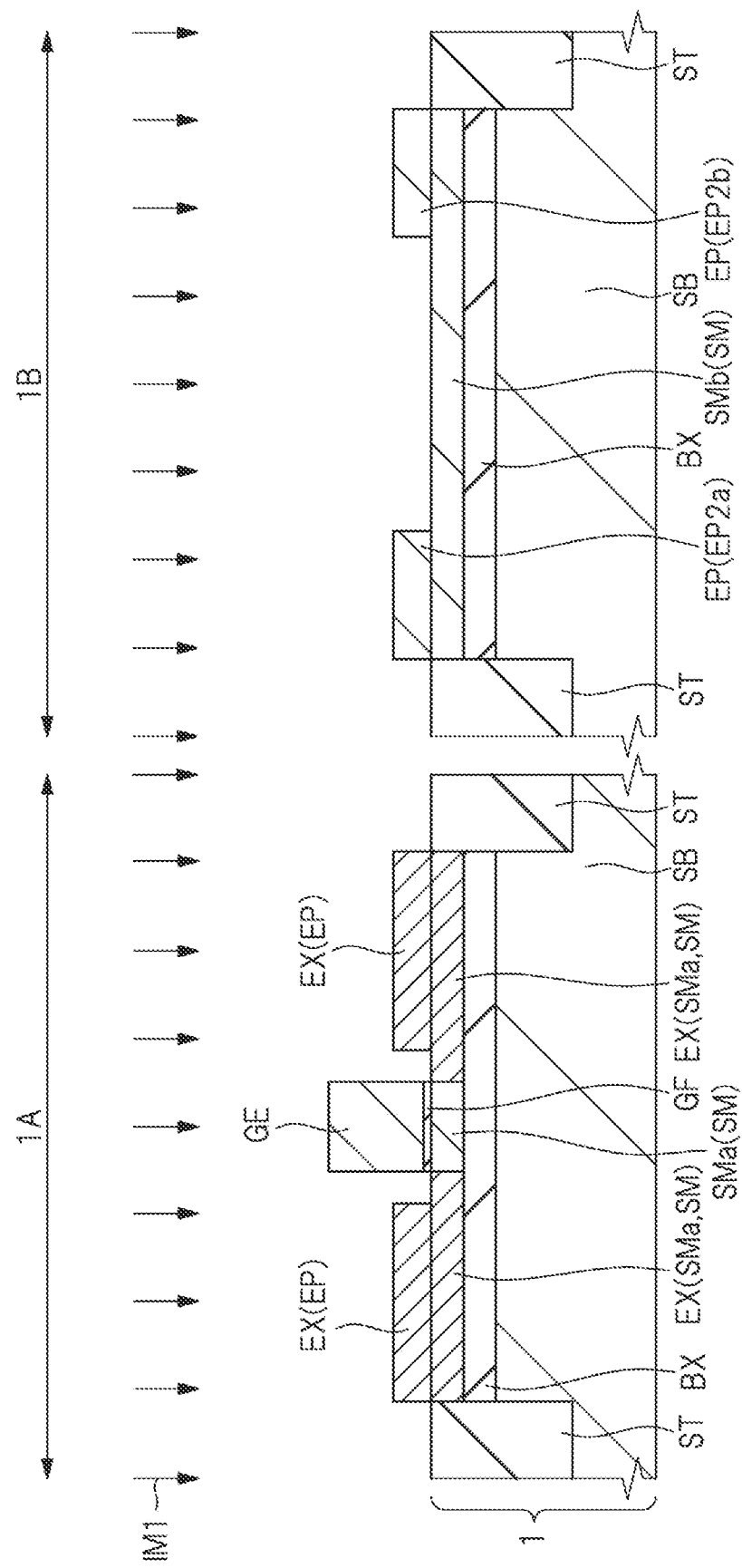
FIG. 16 is the partially enlarged cross-sectional view during the method of manufacturing the semiconductor device following FIG. 15.

Next, as shown in FIG. 16, n-type impurities such as phosphorus (P) or arsenic (As) are ion-implanted into the semiconductor layer SM1 (EP, SM) in the MISFET forming region 1A and the resistive element formation region 1B. This ion implantation is referred to below as the ion implantation IM1 and is schematically indicated by an arrow in FIG. 16. By this ion implantation IM1, in the MISFET forming region 1A, n-type impurities are ion-implanted into the regions on both sides of the gate electrodes GE in the semiconductor layers SM and EP, thereby forming a n− type semiconductor region EX (extension regions and LDD regions). Further, in this ion implantation IM1, since the gate electrode GE can function as a mask (ion implantation blocking mask), in the MISFET forming region 1A, the region located directly below the gate electrode GE of the semiconductor layer SM, n-type impurities are not implanted. Further, in this ion implantation IM1, n-type impurities can be implanted into almost the entire of the semiconductor layers EP and SM in the resistive element-forming regions 1B.

Figure 17:
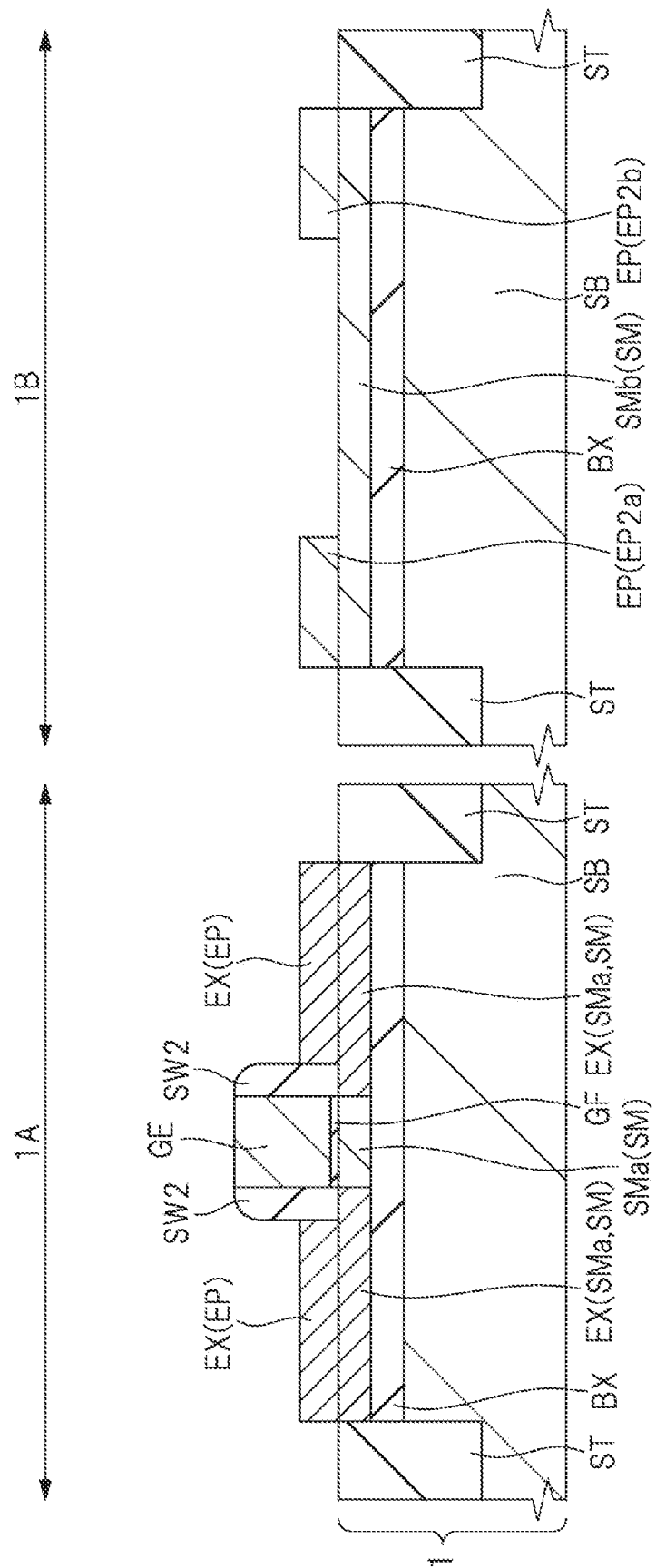
FIG. 17 is the partially enlarged cross-sectional view during the method of manufacturing the semiconductor device following FIG. 16.

Next, as shown in FIG. 17, a sidewall spacer SW2 is formed on the sidewall of the gate-electrode GE as a sidewall insulating film. The sidewall spacer SW2, for example, on the main surface of the SOI substrate 1 (main surface entire), so as to cover the gate electrode GE and the semiconductor layer EP, by forming an insulating film for forming the sidewall spacer SW2, the insulating film by etching back by anisotropic etching technique, can be formed.

The sidewall spacer SW2 is formed on the sidewalls of the gate-electrode GEs in the MISFET forming region 1A. FIG. 17, in the resistive element forming region 1B, the case where the sidewall spacer SW2 is not formed on the sidewall of the semiconductor layer EP is shown.

As another form, when forming the sidewall spacer SW2 on the sidewall of the gate electrode GE in the MISFET forming region 1A, in the resistive element forming region 1B, the sidewall spacer on the sidewall of the semiconductor layer EP may be formed, this case, the sidewall spacer formed on the sidewall of the semiconductor layer EP in the resistive element forming region 1B is made of the same insulator as the sidewall spacer SW2 formed on the sidewall of the gate electrode GE in the MISFET forming region 1A. However, the thickness of the semiconductor layer EP (height) is smaller than the thickness (height) of the gate electrode GE (lower), in the resistive element forming region 1B, the sidewall spacer on the sidewall of the semiconductor layer EP hardly formed, even if the sidewall spacer is formed on the sidewall of the semiconductor layer EP, its dimension (thickness) is smaller than the sidewall spacer SW2. Therefore, even when the sidewall spacer is formed on the sidewall of the semiconductor layer EP in the resistive element forming region 1B, by a subsequent etching step (including a cleaning process), the sidewall spacer on the sidewall of the semiconductor layer EP in the resistive element forming region 1B can be removed.

Figure 18:
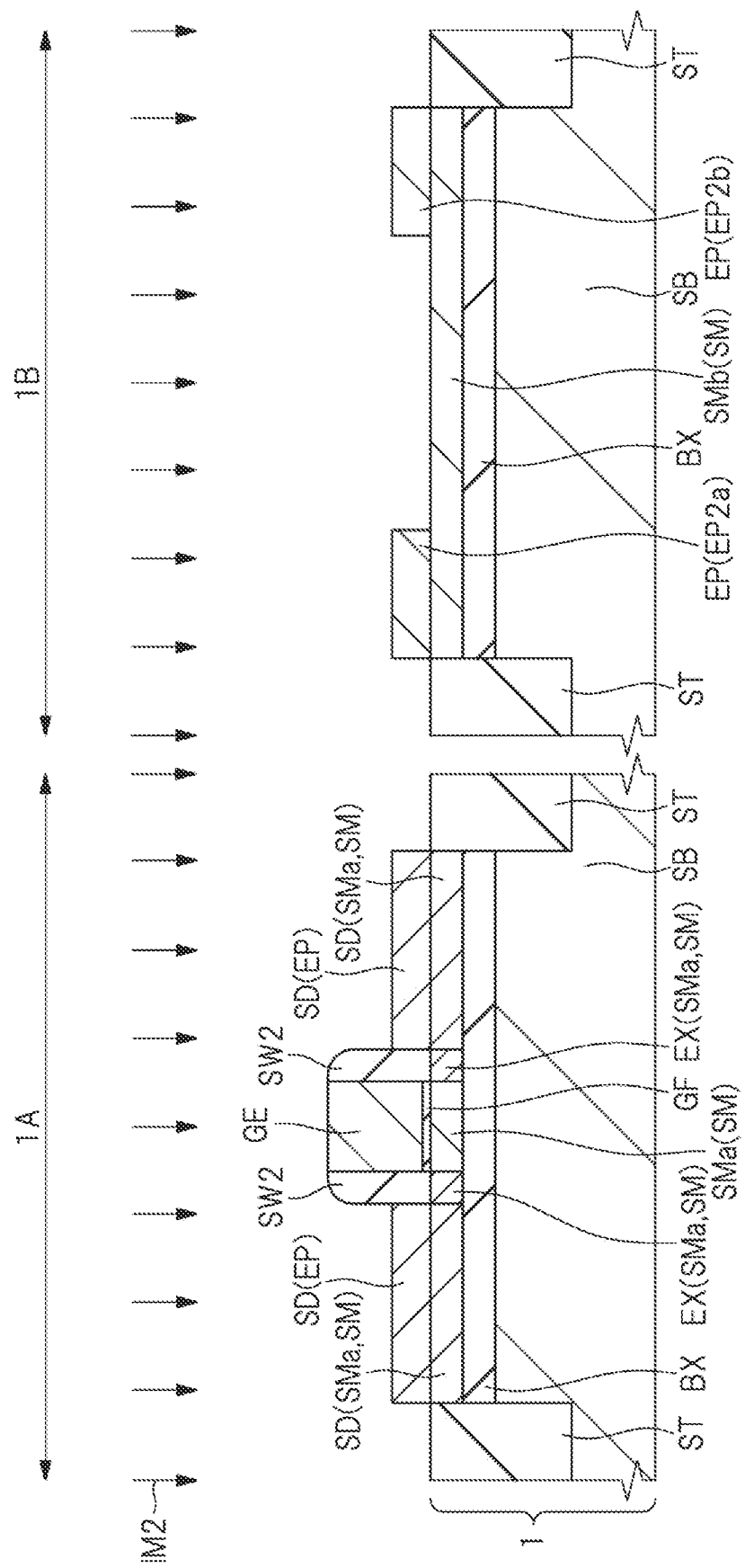
FIG. 18 is the partially enlarged cross-sectional view during the method of manufacturing the semiconductor device following FIG. 17.

Next, as shown in FIG. 18, n-type impurities such as phosphorus (P) or arsenic (As) are ion-implanted into the semiconductor layers EP and SM in the MISFET forming region 1A and the resistive element formation region 1B. This ion implantation is referred to below as the ion implantation IM2 and is schematically indicated by an arrow in FIG. 18. By this ion implantation IM2, in the MISFET forming region 1A, n-type impurities are ion-implanted into regions on both sides of the gate electrode and the sidewall spacer SW2 in the semiconductor layer EP and the semiconductor layer SM, thereby forming n+ type semiconductor regions SD. Further, in this ion implantation IM2, since the gate electrode GE and the sidewall spacer SW2 can function as a mask (ion implantation blocking mask), in the MISFET forming region 1A, the region located directly below the gate electrode GE, and the sidewall spacer SW2 of the semiconductor layer SM n-type impurities are not implanted. Further, in this ion implantation IM2, n-type impurities can be implanted into almost the entire of the semiconductor layers EP and SM in the resistive element-forming regions 1B.

In the MISFET forming region 1A, in the ion implantation IM1, the semiconductor layer EP, and the region not covered with the gate electrode GE in the semiconductor layer SMa, n-type impurities are implanted, in the ion implantation IM2, the semiconductor layer EP, the gate electrode GE in the semiconductor layer SMa and the region not covered with the sidewall spacer SW2, n-type impurities are implanted. The doze amount of the ion injection IM2 is larger than the doze amount of the ion injection IM1, and n+ type semiconductor region SD has a higher n-type semiconductor density than n− type semiconductor region EX. In addition, since the dose amount of the ion implantation IM2 is larger than the dose amount of the ion implantation IM1, the impurity concentration (n-type impurity concentration) of the semiconductor layers EP and SM in the resistive element-forming region 1B is mainly defined by the ion implantation IM2. The impurity concentration (n-type impurity concentration) of the semiconductor layers EP and SM (i.e., the semiconductor portion EP2a, EP2a and the semiconductor layer SMa) in the resistive element forming region 1B is substantially the same as the impurity concentration (n-type impurity concentration) of n+ type semiconductor region SD in the MISFET forming region 1A. n− type semiconductor region EX and n+ type semiconductor region SD form a semiconductor region (a semiconductor region having an LDD (Lightly Doped Drain) structure) for the source or drains of the MISFET.

Next, if necessary, activation annealing is performed which is a heat treatment for activating impurities introduced so far.

Figure 19:
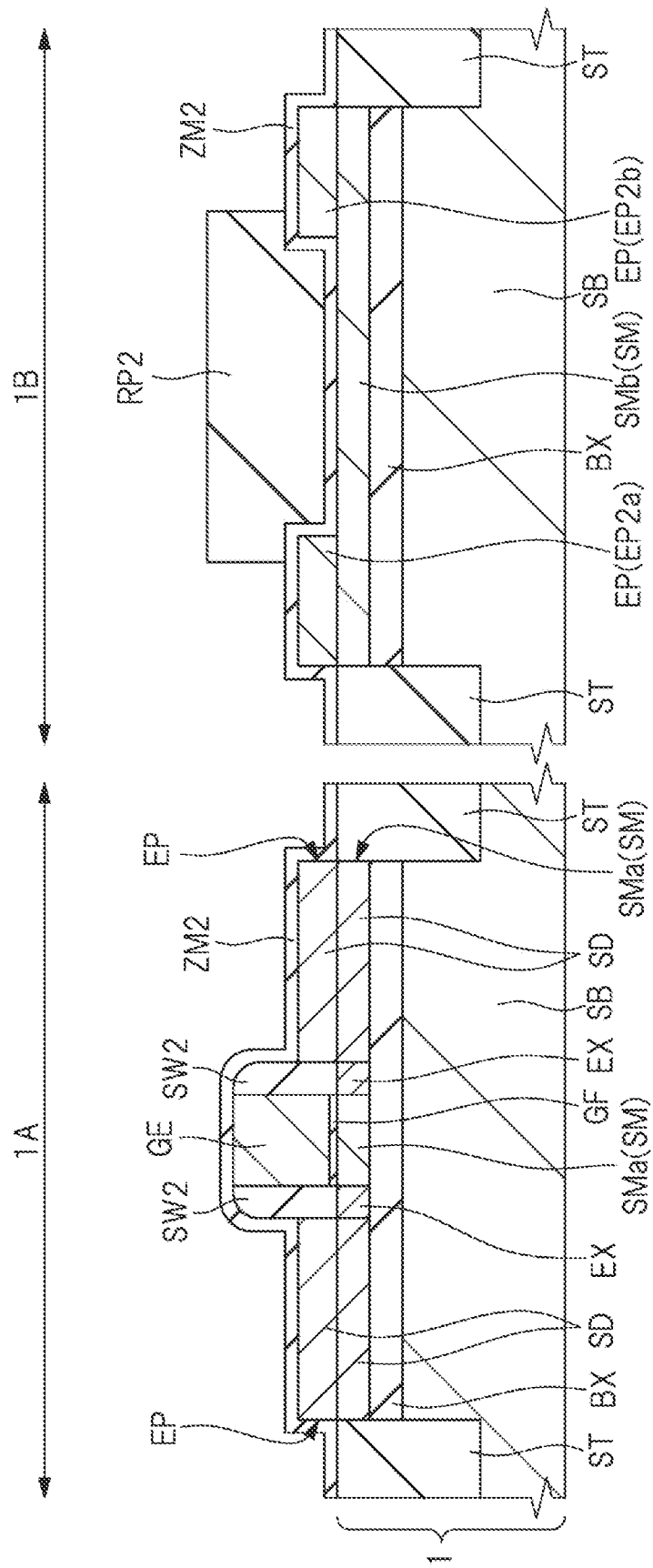
FIG. 19 is the partially enlarged cross-sectional view during the method of manufacturing the semiconductor device following FIG. 18.

Next, as shown in FIG. 19, an insulating film ZM2 is formed on the main surface of the SOI substrate 1 so as to cover the gate electrode GE, the sidewall spacer SW2, and n+ type semiconductor region SD in the MISFET forming region 1A, and so as to cover the semiconductor layers EP and SM in the resistive element formation region 1B. The insulating film ZM2 is formed of, for example, a silicon oxide film, and can be formed by a CVD method or the like.

Next, as shown in FIG. 19, a photoresist pattern RP2 is formed on the insulating film ZM2 using a photolithography technique. The photoresist pattern RP2 is mainly formed on the resistive element forming region 1B.

Figure 20:
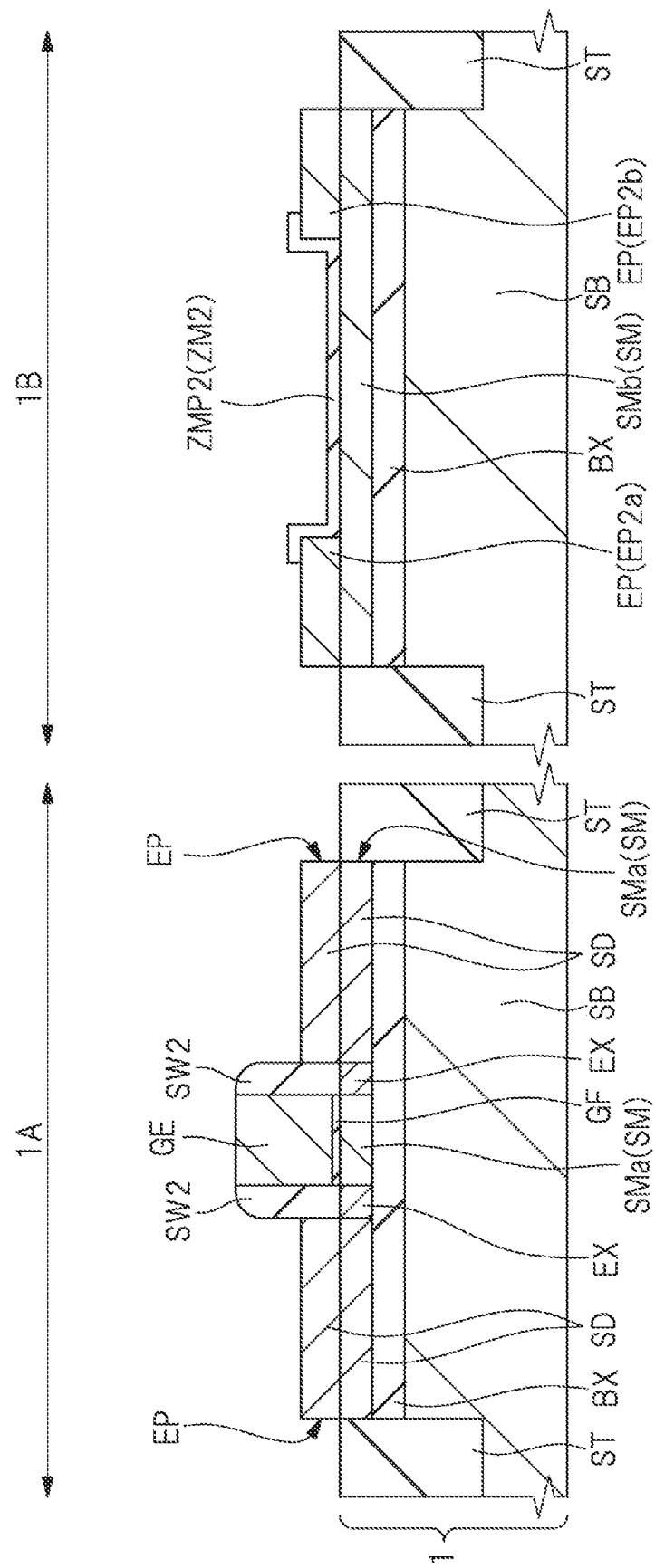
FIG. 20 is the partially enlarged cross-sectional view during the method of manufacturing the semiconductor device following FIG. 19.

The photoresist pattern RP2 is then used as an etch mask to etch the insulating film ZM2. This etching step, the insulating film ZM2 beneath the photoresist pattern RP2 remains as the insulating film pattern (patterned insulating film) ZMP2, the other insulating film ZM2 is removed is etched. Thereafter, the photoresist pattern RP2 is removed by asking or the like, and FIG. 20 shows this step. In this pattern, in the resistive element forming region 1B, the semiconductor layer EP, an insulating film patterned ZMP2 is formed on SM. In the resistance element forming region 1B, of the semiconductor layer SMa, a region not covered with the semiconductor layer EP (corresponding to the region RG2) is preferably covered with the insulating film pattern ZMP2. Further, in the resistive element forming region 1B, the insulating film pattern ZMP2 is riding on a portion of the semiconductor layer EP (semiconductor portion EP2a, EP2a), a portion of upper surface of the semiconductor layer EP semiconductor portion EP2a, EP2a is covered with the insulating film pattern ZMP2.

Figure 21:
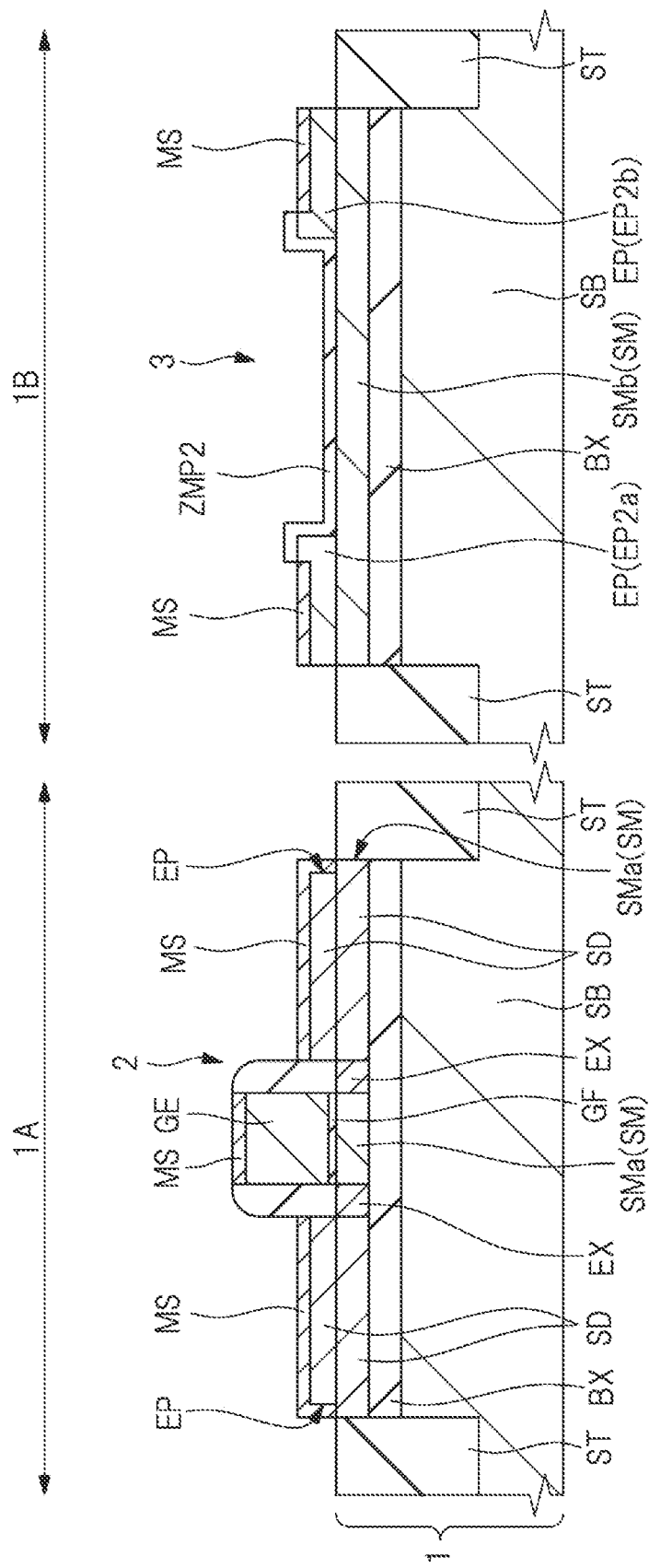
FIG. 21 is the partially enlarged cross-sectional view during the method of manufacturing the semiconductor device following FIG. 20.

Next, as shown in FIG. 21, a metal silicide layer (metal compound layer) MS is formed by a Salicide (Self Aligned Silicide) technique. In the MISFET forming region 1A, the metal silicide layer MS is formed on the surface (upper layer portion) of n+ semiconductor region SD, that is, on the surface (upper layer portion) of the semiconductor layer EP and on the surface (upper layer portion) of the gate electrode GE. Further, in the resistive element forming region 1B, the metal silicide layer MS, of the surface of the semiconductor layer EP (semiconductor portion EP2a, EP2a), is formed in a portion not covered with the insulating film pattern ZMP2. In the resistive element forming region 1B, the surface of the semiconductor layer SM, the metal silicide layer MS is not formed.

The metal silicide layer MS forming step can be performed, for example, as follows. That is, first, on the main surface of the SOI substrate 1, a metal film (metal film for forming the metal silicide layer MS) is formed on the main surface of the SOI substrate 1 so as to cover the gate electrode GE, the sidewall spacer SW2, and n+ type semiconductor region SD in the MISFET forming region 1A, and so as to cover the semiconductor layers EP, SM, and the insulating film patterns ZMP2 in the resistive element forming region 1B. The metal film is made of, for example, a cobalt film, a nickel film, or a nickel platinum alloy film. Then, by performing heat treatment, the metallic film reacts with the gate electrode GE and n+ type semiconductor region SD in the MISFET forming region 1A, and reacts with the semiconductor layer EP (semiconductor portion EP2a, EP2a) in the resistive element formation region 1B. As a result, a metal silicide layer MS is formed which is a reactive layer (compound layer) between the metal (metal film) and the semiconductor (gate electrodes GE, n+ type semiconductor regions SD, and semiconductor layers EP). Thereafter, the unreacted metal film is removed. FIG. 21 shows this step. When the metal film (metal film for forming the metal silicide layer MS) is a nickel film, the metal silicide layer MS is a nickel silicide layer, and when the metal film is a nickel platinum alloy film, the metal silicide layer MS is a nickel platinum silicide layer.

In the resistance element forming region 1B, of the surface of the semiconductor layer EP (semiconductor portion EP2a, EP2a), the portion not covered with the insulating film pattern ZMP2, although the metal silicide layer MS is formed, the portion covered with the insulating film pattern ZMP2, the metal silicide layer MS is not formed. Further, in the resistive element forming region 1B, of the semiconductor layer SMb, a portion not covered with the semiconductor layer EP is covered the insulating film pattern ZMP2. Therefore, in the resistive element forming region 1B, the surface of the semiconductor layer SMb, the metal silicide layer MS is not formed. The insulating film patterns ZMP2 may function as a silicide blocking layer for preventing the metallic silicide layer MS from being formed.

In this way, the MISFET 2 is formed in the MISFET forming region 1A, the resistive element 3 is formed in the resistive element forming region 1B.

Figure 22:
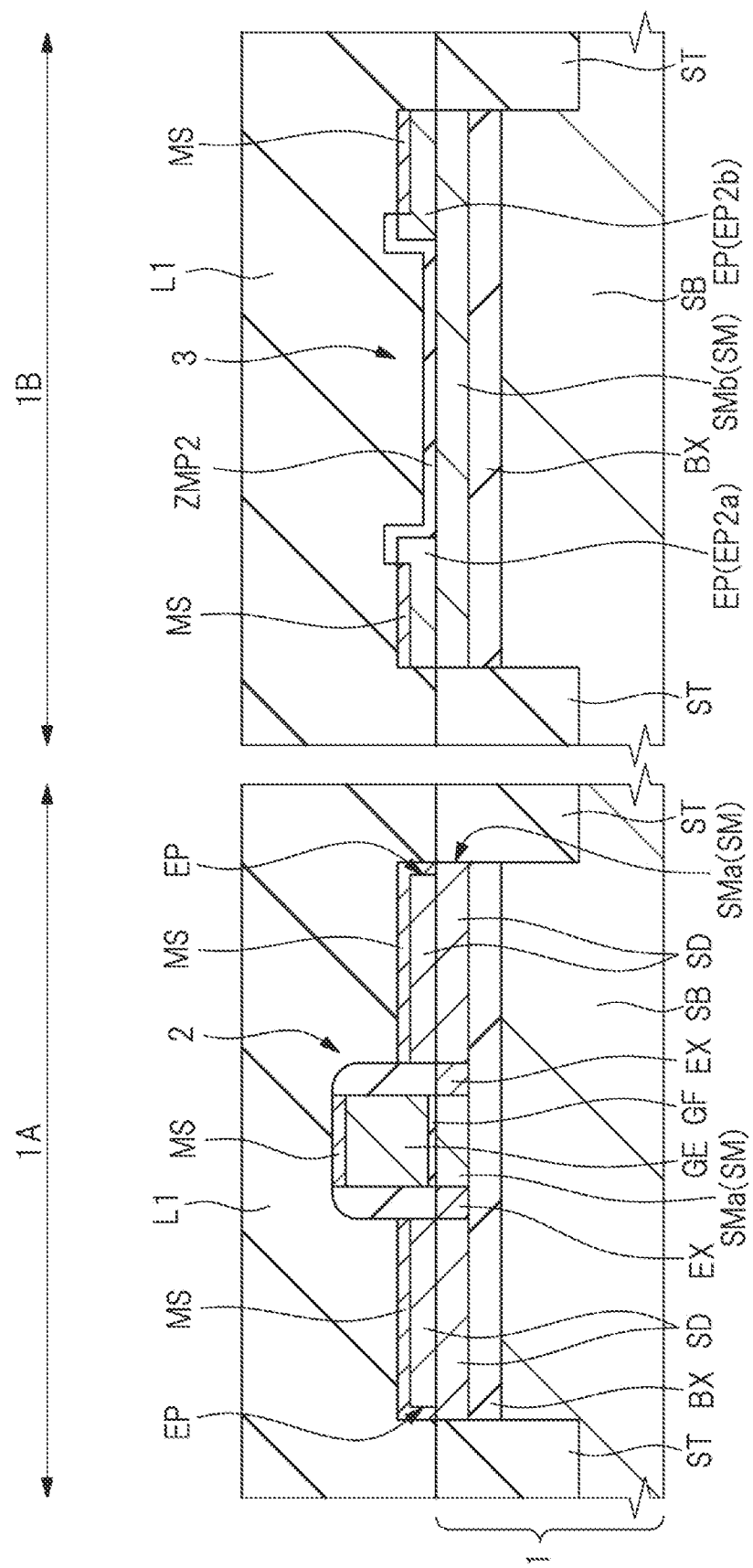
FIG. 22 is the partially enlarged cross-sectional view during the method of manufacturing the semiconductor device following FIG. 21.

Next, as shown in FIG. 22, on the main surface of the SOI substrate 1, the gate electrode GE, the semiconductor layer EP, SM, so as to cover the sidewall spacer SW2 and the metal silicide layer MS, an insulating film as an interlayer insulating film (interlayer insulating film) L1 is formed.

The insulating film L1, for example, a laminated film between the silicon nitride film and the silicon oxide film on the silicon nitride film (thicker silicon oxide film than the silicon nitride film), or a single film of the silicon oxide film can be used. After forming the insulating film L1, if required, it is also possible to increase the flatness of upper surface of the insulating film L1 by polishing upper surface of the insulating film L1 by the CMP method.

Figure 23:
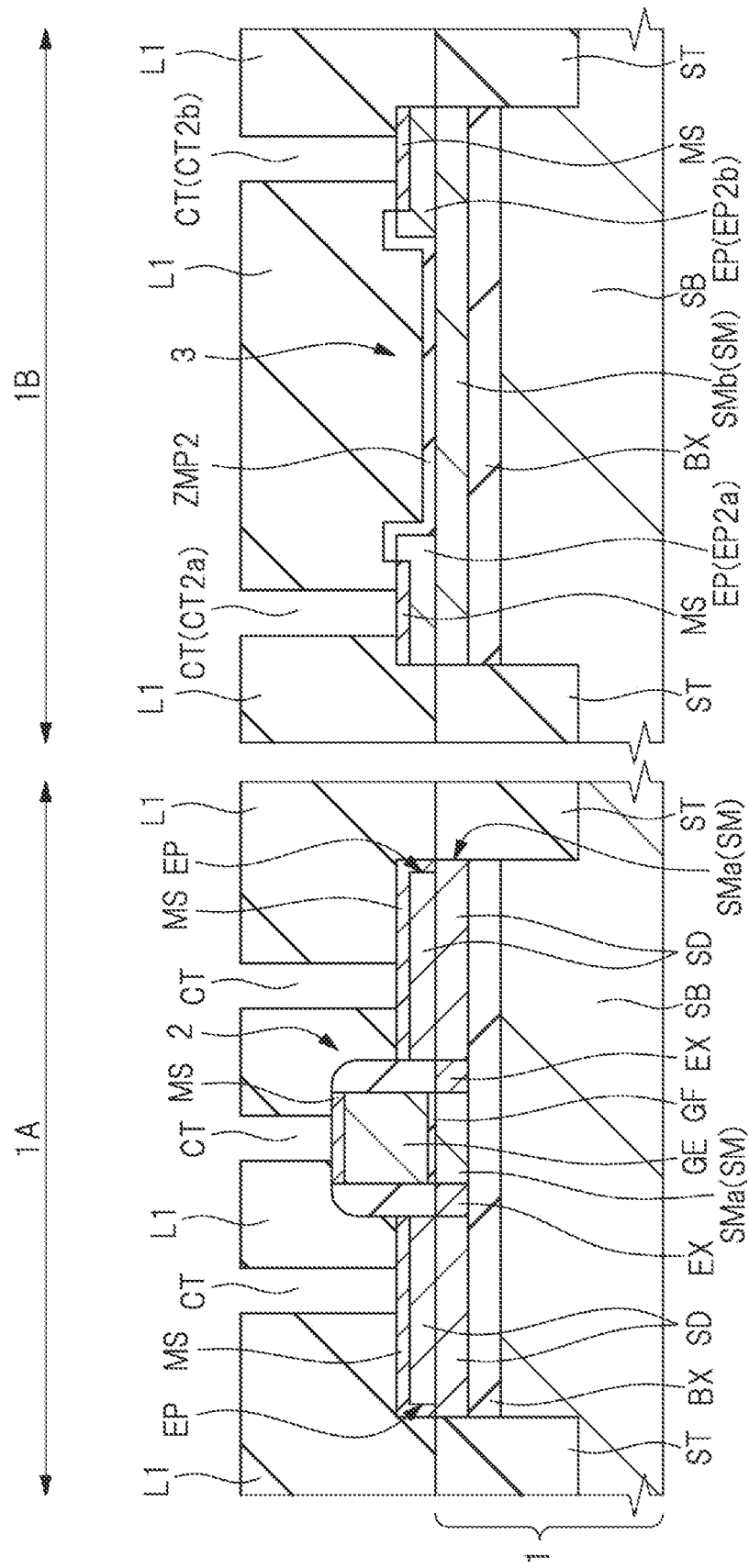
FIG. 23 is the partially enlarged cross-sectional view during the method of manufacturing the semiconductor device following FIG. 22.

Next, as shown in FIG. 23, using a photoresist pattern formed on the insulating film L1 (not shown) as an etching mask, by etching the insulating film L1 (preferably dry etching), contact holes in the insulating film L1 (through holes, holes) to form a CT. Contact hole CT is formed so as to penetrate the insulating film L1. In the MISFET forming region 1A, the contact hole CT is former on the gate electrodes GE and n+ semiconductor regions SD. Further, in the resistive element forming region 1B, the contact hole CT is formed on the semiconductor layer EP (semiconductor portion EP2a, EP2a). In the contact hole CT forming step, the metal silicide layer MS and the semiconductor layer EP as compared with the insulating film L1, SM is less likely to be etched conditions, it is preferable to perform etching.

Figure 24:
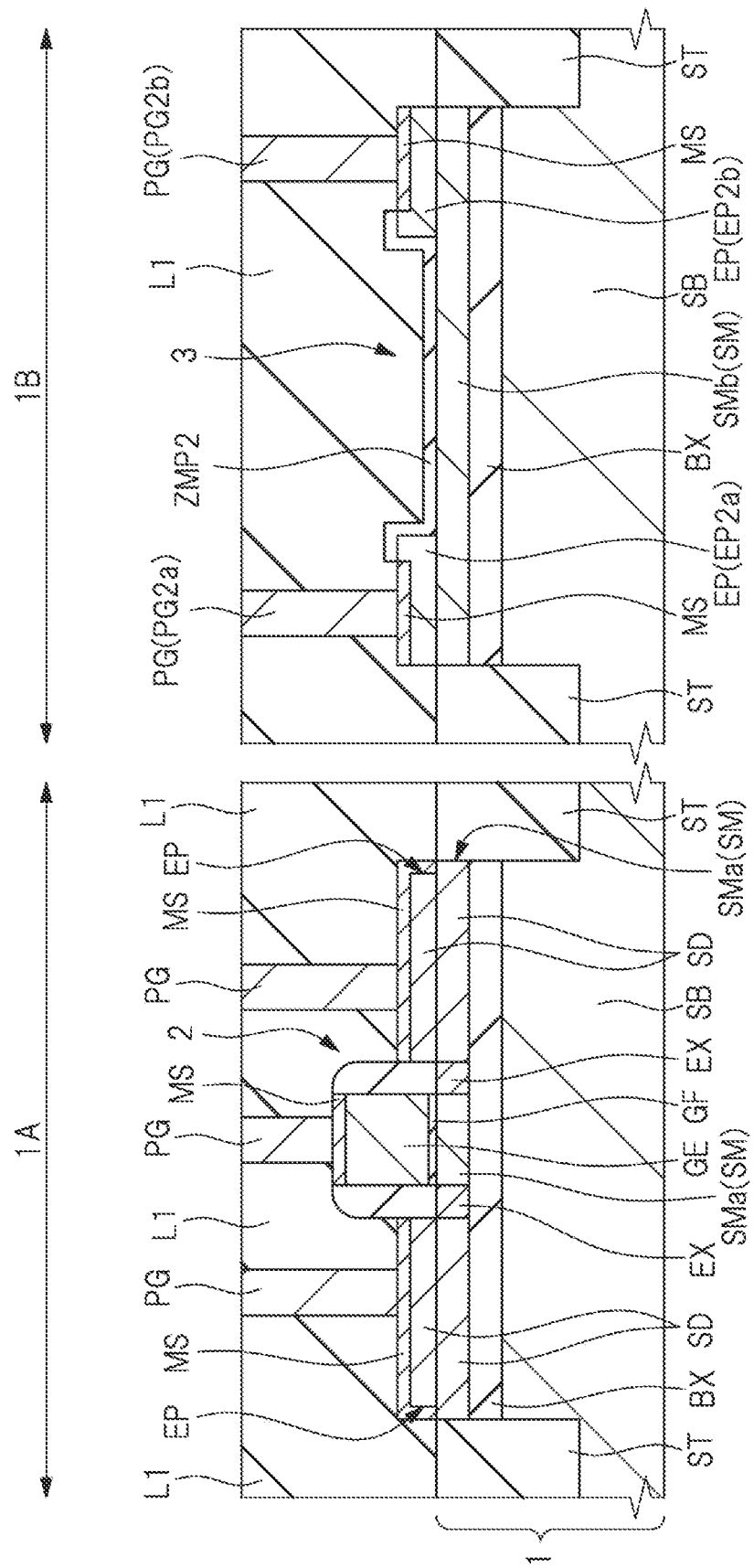
FIG. 24 is the partially enlarged cross-sectional view during the method of manufacturing the semiconductor device following FIG. 23.

Next, as shown in FIG. 24, a conductive plug PG made of tungsten (W) or the like is formed in the contact hole CT as a conductive portion for connecting. A plug PG can be formed as follows.

To form the plug PG, first, on the insulating film L1 including the inside of the contact hole CT (bottom and on the side wall), a barrier conductor film (e.g., titanium film, titanium nitride film, or a laminated film thereof) by a sputtering method or plasma CVD method. Then, a main conductor film made of a tungsten film or the like is formed on the barrier conductor film by the CVD method or the like so as to fill the contact hole CT. Thereafter, unnecessary main external films and barrier conductor films on the insulating film L1 outside the contact hole CT are removed by the CMP method, an etch-back method, or the like. As a result, upper surface of the insulating film L1 is exposed, and the plug PG are formed by the barrier conductor film and the main conductor film remaining in the contact hole CT.

Figure 25:
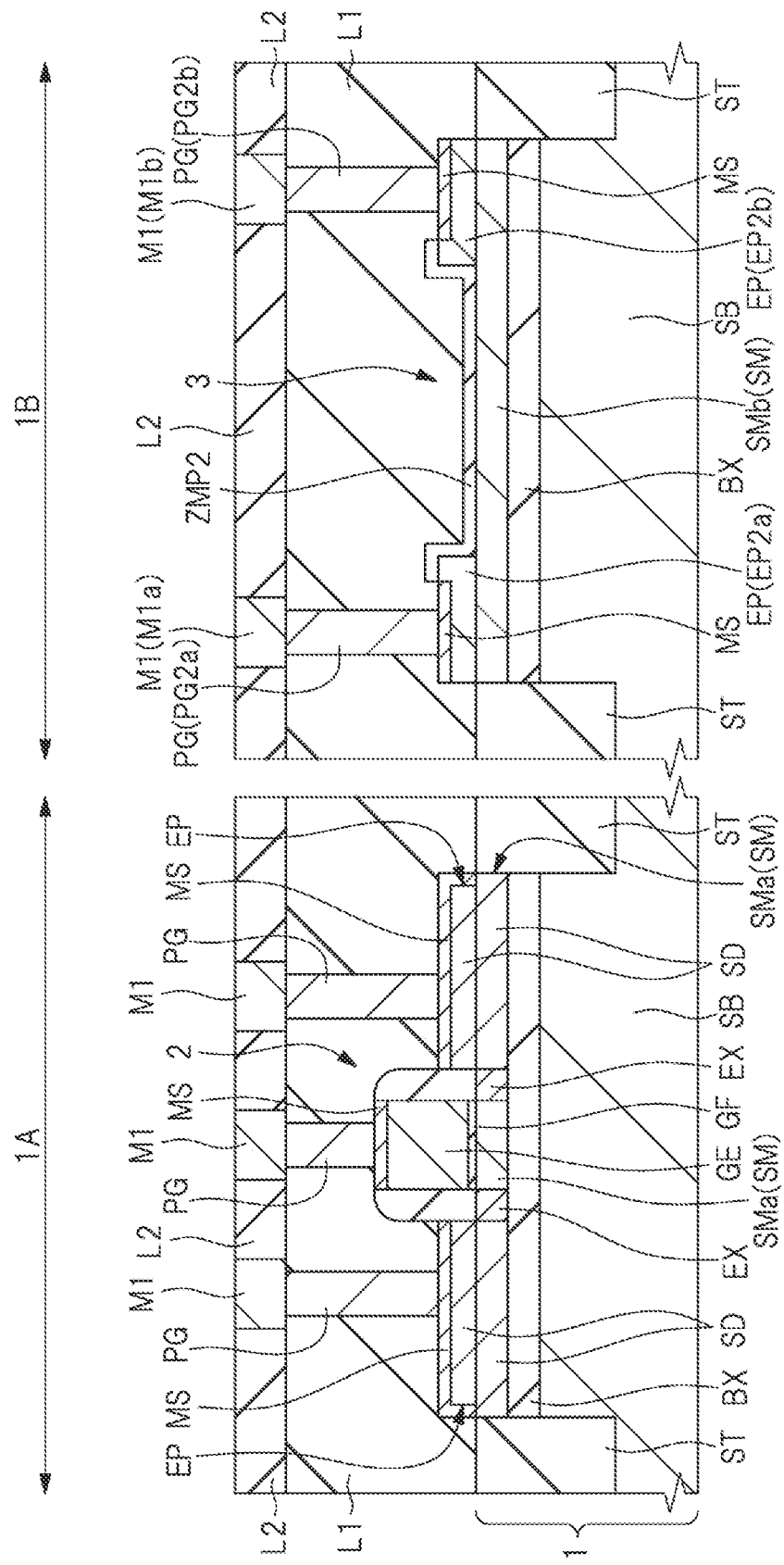
FIG. 25 is the partially enlarged cross-sectional view during the method of manufacturing the semiconductor device following FIG. 24.

Next, as shown in FIG. 25, on the insulating film L1 plug PG is embedded, to form an insulating film L2 for forming a wiring. The insulating film L2 can be a single film (single insulating film) or a laminated film (laminated insulating film).

Next, as shown in FIG. 25, a wiring M1 which is the wiring of the first layer is formed using the single damascene method. Specifically, first, after forming the wiring grooves (grooves for embedding the wiring M1) in a predetermined area of the insulating film L2 by dry etching with a photoresist pattern (not shown) as a mask, the SOI substrate 1 on the main surface (i.e. the insulating film L2 including the bottom and the side wall of the wiring groove on) to form a barrier conductor film (barrier metal film). As the barrier conductor film, for example, a titanium nitride film, a tantalum film, a tantalum nitride film, or the like can be used. Subsequently, a seed layer of copper is formed on the barrier conductor film by the CVD method or a sputtering method, and a copper plating film (main conductor film) is formed on the seed layer by further using an electrolytic plating method or the like. Embedding the inside of the wiring groove by copper plating film. Then, the copper plating film in the region other than the wiring groove, the seed layer and the barrier metal film are removed by the CMP method, in the wiring groove, to form a first layer of the wiring M1 having copper as a main conductive material.

Thereafter, to form a second layer and subsequent wiring by a dual damascene method or the like, illustration and description thereof will be omitted here. The wiring of the upper layer than the wiring M1 and it is not limited to damascene wiring, it can also be formed by patterning the conductive film for wiring, for example, tungsten wiring or aluminum wiring it can also be.

As described above, a semiconductor device of the present embodiment is manufactured.

Examination Example

Figure 26:
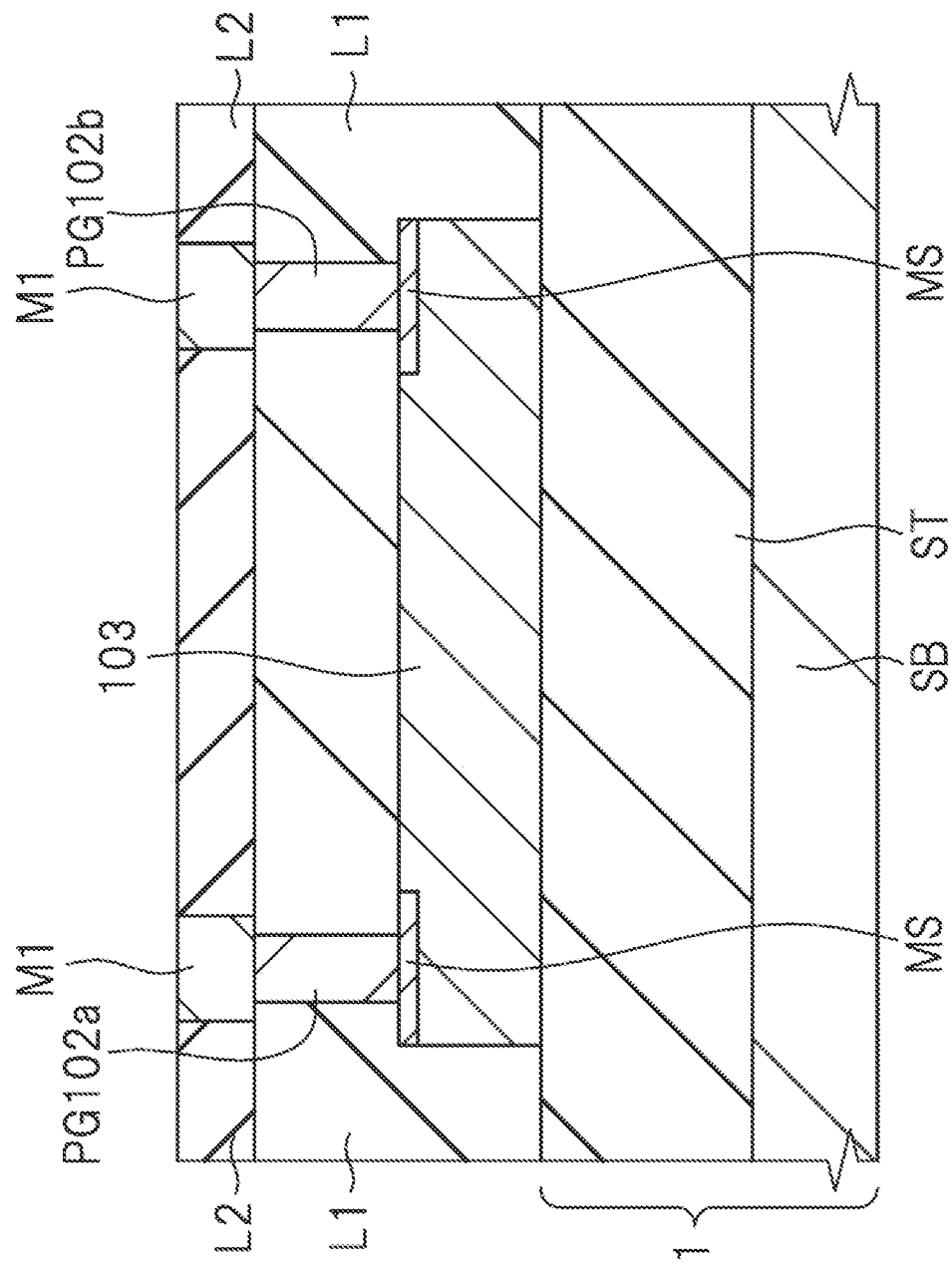
FIG. 26 is a partially enlarged cross-sectional view of a semiconductor device of examined example.

FIG. 26 is a fragmentary cross-sectional view of a semiconductor device of an example studied by the present inventors, FIG. 26, a cross-sectional view of a region where the resistive element 103 is formed is shown.

As shown in FIG. 26, in the semiconductor device of examined example, the resistive element 103 is formed on an element isolation region ST. On the surface of both end portions of the resistive element 103, each metal silicide layer MS is formed. The insulating film L1 is an interlayer insulating film covers the resistive element 103, the plug PG102a, PG102b is connected to the metal silicide layer MS of the surface of both ends of the resistive element 103. Resistive element 103 is made of polysilicon, it can be formed by a polysilicon film having the same layer as the gate electrode (corresponding to the gate electrode GE). That is, by patterning a common polysilicon film, it is possible to form a gate electrode and the resistance element 103.

For examined example of FIG. 26, by patterning a common polysilicon film, the gate electrode and the resistive element 103 can be formed, but inevitably the thickness of the resistive element 103 becomes the same as the thickness of the gate electrode. For example, when the thickness of the gate electrode is 100 nm, the thickness of the polysilicon film composing the resistive element 103 also becomes 100 nm. The thickness of the gate-electrode is designed considering the properties of the MISFET, etc. Therefore, it is difficult to set the thickness of the gate electrode in consideration of the characteristics required for the resistive element 103 (i.e., the thickness of the resistive element 103). For example, if the thickness of the resistive element 103 is reduced, the resistance value of the resistive element 103 is increased, when reducing the thickness of the resistive element 103, since the thickness of the gate electrode is also reduced, the resistance of the resistive element 103 by reducing the thickness of the resistive element 103 it is difficult to increase the value.

Therefore, in order to increase the resistance of the resistive element 103 in examined example of FIG. 26, it is effective to reduce the impurity concentrations in the polysilicon film composing the resistive element 103. If reducing the impurity concentration in the polysilicon film composing the resistive element 103, since the resistivity of the resistive element 103 is increased, it is possible to increase the resistance value of the resistive element 103. Therefore, by reducing the impurity concentration in the polysilicon film composing the resistive element 103, even without reducing the thickness of the resistive element 103, it is possible to increase the resistance value of the resistive element 103.

However, when reducing the impurity concentration in the polysilicon film composing the resistive element 103, a disadvantage that the temperature coefficient of resistance of the resistive element 103 (resistance temperature coefficient) is increased occurs. Here, the resistance temperature coefficient corresponds to a coefficient representing how much ratio the resistance changes per temperature 1° C. When the resistance temperature coefficient of the resistive element 103 is increased, the temperature dependency of the resistance value of the resistive element 103 is increased, and changes in the environmental temperature of semiconductor device, due to temperature changes in semiconductor device due to heat generation, etc., the resistance value of the resistive element 103 will change considerably, there is a possibility that the characteristics of the circuit utilizing the resistive element 103 is changed. This can be a factor that reduces the reliability of semiconductor device.

When an impurity is introduced into the polysilicon film composing the resistive element 103 in the ion implantation process for forming n+ semiconductor region SD of the MISFET, the impurity concentration in the polysilicon film composing the resistive element 103 becomes considerably high. In this case, although the increase in the resistance temperature coefficient of the resistive element 103 is suppressed, since the resistivity of the resistive element 103 is reduced, it is difficult to increase the resistance of the resistive element 103. Therefore, when the impurity concentration of the polysilicon film composing the resistive element 103 is made lower than the impurity concentration of the source/drain region (n+ type semiconductor region SD), the step of implanting ions of the impurity into the polysilicon film composing the resistive element 103 is required separately from the ion implantation step for forming the source/drain region, which leads to an increase in the number of manufacturing steps of semiconductor device and increases the manufacturing costs of semiconductor device.

Further, without reducing the impurity concentration in the pol con film composing the resistive element 103, and without reducing the thickness of the resistive element 103, when an attempt is made to increase the resistance value of the resistive element 103, the length of the resistive element 103 (the length along the direction in which the current flows) it is necessary to increase. This, in semiconductor device, because it leads to an increase in the region required to place the resistive elements 103, in terms of miniaturization of semiconductor device (area reduction) is disadvantageous.

<Main Feature and Effects>

One of the main features of the present embodiment, the semiconductor layer SM composing the SOI substrate, and the epitaxial semiconductor layer (semiconductor layer EP) formed on the semiconductor layer SM, it is to form a resistive element 3.

Specifically shown FIG. 2-FIG. 5, a semiconductor layer SMb is a semiconductor layer SM located in the resistive element forming region 1B, a semiconductor layer EP (epitaxial semiconductor layer) formed on the semiconductor layer SMb, the resistive element 3 is formed. Semiconductor layer EP has two semiconductor portion EP2a, EP2b formed apart from each other on the semiconductor layer SMb. Semiconductor layer SMb includes a region RG1a (first connecting portion) on which the semiconductor portion EP2a is formed, and a region RG1b (second connecting portion) on which the semiconductor portion EP2b is formed, located between the region RG1a and the region RG1b, the semiconductor layer EP is not formed thereon and a region RG2 (element portion).

In the present embodiment, the semiconductor layer SMb composing the resistive element 3 has a region RG2 on which the semiconductor layer EP is not formed, by this region RG2, it is possible to increase the resistance of the resistive element 3. That is, on the semiconductor layer SMb located in the region RG2 is not formed semiconductor layer EP, the thickness of the resistive element 3 in the region RG2 is thinner than the thickness of the resistive element 3 in each region RG1a, RG1b. Thus, it is possible to increase the resistance of the resistive element 3 by this region RG2. Specifically, the thickness T1 of the semiconductor layer SMb (see FIG. 2) is thinner than the thickness of the gate electrode GE, preferably, 30 nm or less (T1 ≤30 nm). Located in the region RG2, and its thickness T1 is thin (small) semiconductor layer SMb by the current path of the resistive element 3 it is possible to increase the resistance value of the resistive element 3, as a high impurity concentration of the semiconductor layer SMb (particularly part located in the region RG2) composing the resistive element 3, while suppressing an increase in the resistance temperature coefficient of the resistive element 3, it is possible to increase the resistance value of the resistive element 3. Even when increasing the impurity concentration in the region RG2 of the semiconductor layer SMb, it is possible to increase the resistance value of the resistive element 3, it is possible to suppress the resistance temperature coefficient of the resistive element 3. Thus, the change in the environmental temperature of semiconductor device, due to such temperature change of semiconductor device due to heat generation, it is possible to suppress the resistance value of the resistive element 3 is changed, the circuit utilizing the resistive element 3 characteristics can be suppressed or prevented from being changed, it is possible to improve the reliability of semiconductor device. Further, the thickness T1 is the region RG2 of the thin semiconductor layer SMb, by operating the resistance value of the resistive element 3, the length of the resistive element 3 required to ensure the required resistance value (the length along the direction in which the current flows) it is possible to suppress. Thus, in semiconductor device, it is possible to suppress the region required to place the resistive element 3, which is advantageous for miniaturization of semiconductor device (reduced area).

It is preferable that the impurity concentrations of the semiconductor portions EP2*a*, EP2*b* and the semiconductor layer SMb, particularly the impurity concentrations of the regions RG2 of the semiconductor layer SMb, be $1\times10^{21}/\text{cm}^3$ or more. Thus, it is possible to accurately suppress the increase in the resistance temperature coefficient of the resistive element 3. Note that the impurity concentration of the present embodiment is, for example, an n-type impurity concentration.

For example, when impurity concentration in the silicon region composing the resistive element is about $1\times10^{19}/\text{cm}^3 \sim 1\times10^{20}/\text{cm}^3$, the resistive temperature coefficient of the resistive element becomes 1000 ppm/° C. or more, and the resistive value changes by 10% or more due to a temperature change of 100° C. Therefore, by setting the impurity concentration of the semiconductor layer SMb in the region RG2 of the semiconductor layer SMb to $1\times10^{21}/\text{cm}^3$ or more, the rate of change of the resistance value of the resistive element 3 can be reduced, and as a result, the temperature-dependence of the resistance value of the resistive element 3 can be effectively reduced. For example, the resistor temperature coefficient of the resistive element 3 can be set to 100 ppm/° C. or less.

In addition, in an ion implantation step (corresponding to the ion implantation IM2) for forming the source/drain regions (n+ type semiconductor regions SD) of the MISFET, the impurity ions can be implanted into the semiconductor portions EP2*a*, EP2*b* and the semiconductor layers SMb. As a result, the impurity concentrations of the semiconductor portions EP2*a*, EP2*b* and the semiconductor layer SMb (in the particular, impurity concentration of the region RG2 of the semiconductor layer SMb) can be set to be substantially the same as the impurity concentration of the source/drain region (in the present embodiment, the n-type impurity concentration) of the MISFET (n+ type semiconductor region SD), and can be set to, for example, $1\times10^{21}/\text{cm}^3$ or more. As a result, it is possible to increase the impurity concentration of the region RG2 of the semiconductor layer SMb and suppress the increase of the resistance temperature coefficient of the resistive element 3, and it is possible to commonly perform the step of ion implantation of the impurity into the region RG2 of the semiconductor layer SMb and the step of ion implantation for forming the source/drain region type semiconductor region SD), thereby suppressing the number of manufacturing steps of semiconductor device. Therefore, it is possible to suppress the manufacturing cost of semiconductor device.

Further, the MISFET 2 and the resistive element 3 are formed by using the semiconductor layer SM of the SOI substrate 1, and the channel region of the MISFET 2 is formed in the semiconductor layer SMa located immediately below the gate electrode GE. Therefore, the thickness T1 of the region RG2 of the semiconductor layer SMb is substantially equal to the thickness of the semiconductor layer SMa located immediately below the gate electrode GE of the MISFET. The thickness of each of the semiconductor layer SMa and the semiconductor layer SMb is preferably 30 nm or less, and preferably 3 nm to 30 nm.

Further, as in the above FIG. 7, when the resistive element 3 is used in the bias current generating portion 4, as the resistance value of the resistive element 3, there may be a considerably large resistance value is required. For example, 2 kΩ or more sheet resistance may be required as a resistive element 3. Further, when the resistive element 3 is used in the bias current generating portion 4, it may be required that the resistance temperature coefficient of the resistive element 3 is small. In the present embodiment, located in the region RG2, and, by the semiconductor layer SMb on which the semiconductor layer EP is not formed is the current path of the resistive element 3, the semiconductor layer SMb (particularly portions located in the region RG2) even if increasing the impurity concentration, it is possible to increase the resistance value of the resistive element 3. Therefore, while reducing the resistance value change rate of the resistive element 3, it is possible to increase the resistance value of the resistive element 3, even when using the resistive element 3 in the bias current generating portion 4, it is possible to accurately improve the reliability of semiconductor device, to suppress the area required to place the resistive element 3, it is possible to reduce the size of semiconductor device (reduction in area). For example, even when 2 kΩ or more sheet resistance is required as the resistive element 3, by suppressing the area required to place the resistive element 3, it is possible to reduce the size of semiconductor device (reduced area).

Here, unlike the present embodiment, it is assumed that the semiconductor layer EP (semiconductor portion EP2*a*, EP2*b*) was not formed on the semiconductor layer SMb. In this case, each plug PG2*a*, PG2*b* will be connected to the semiconductor layer SMb, rather than each semiconductor portion EP2*a*, EP2*b*. However, in this case, when forming the contact hole CT, since the thickness of the semiconductor layer SMb is thin, it is feared that each contact hole CT2*a*, CT2*b* penetrates through the semiconductor layer SMb. If the contact hole (CT2*a* CT2*b*) penetrates through the semiconductor layer SMb, the insulating layer BX is exposed at the bottom portion of the contact hole (CT2*a* and/or CT2*b*), thereby the exposed insulating layer BX is also etched. Accordingly, the contact hole (CT2*a* and/or CT2*b*) may penetrate the insulating layer BX as well. Because, the step for forming the contact hole CT is performed with a condition that the insulating film L1 will be etched easily compared with the semiconductor layer SM. Therefore, if the insulating layer BX is exposed at the bottom portion of the contact hole CT, the contact hole CT is insulating layer BX because there is a possibility that the contact hole (CT2a and/or CT2b) penetrates through the insulating layer BX, as the exposed insulating layer BX is likely to be etched by the above condition. Also, if the contact hole (CT2a and/or CT2b) penetrates through the insulating layer BX, the plug (PG2a and/or PG2b) is connected to the semiconductor substrate SB through the insulating layer BX. Therefore, reaching the contact hole CT2a, CT2b to the insulating layer BX should be prevented.

In contrast, in the present embodiment, the semiconductor portion EP2a is formed on the region RG1a of the semiconductor layer SMb, the semiconductor portion EP2b is formed on the region RG1b of the semiconductor layer SMb, the plug PG2a is arranged on the semiconductor portion EP2a and is electrically connected with the semiconductor portion EP2a, and the plug PG2b is arranged on the semiconductor portion EP2b and is electrically connected with the semiconductor portion EP2b. Therefore, when the contact hole CT is formed, the contact hole (CT2a and/or CT2b) can be accurately prevented from penetrating through each of the semiconductor portion EP and the semiconductor layer SMb. That is, since the contact hole CT2a is formed on the semiconductor portion EP2a, it is necessary that the contact hole CT2a penetrates through each of the semiconductor portion EP2a and the semiconductor layer SMb so that the contact hole CT2a reaches to the insulating layer BX. However, in the present embodiment, since the semiconductor portion EP2a is present, it is difficult that the contact hole CT2a reaches the insulating layer BX. Further, since the contact hole CT2b is formed on the semiconductor portion EP2b, it is necessary that the contact hole CT2b penetrates through each of the semiconductor portion EP2b and the semiconductor layer SMb so that the contact hole CT2b reaches to the insulating layer BX. However, in the present embodiment, since the semiconductor portion EP2b is present, it is difficult that the contact hole CT2b reaches the insulating layer BX. Therefore, when forming the contact hole CT, it is possible to prevent from reaching the contact hole (CT2a and/or CT2b) to the insulating layer BX. Accordingly, the contact hole CT2a, CT2b can be accurately prevented from penetrating through the insulating layer BX, thereby it is possible to accurately prevent the plug PG2a, PG2b is connected to the semiconductor substrate SB through the insulating layer BX. Thus, the reliability of the semiconductor device can be improved. Further, it is possible to improve the manufacturing yield of the semiconductor device.

Further, unlike the present embodiment, when the semiconductor layer EP is not formed on the semiconductor layer SMb (semiconductor portion EP2a, EP2b), the metal silicide layer MS is formed in the semiconductor layer SMb. However, since the thickness of the semiconductor layer SMb is thin, there is a possibility that the metal silicide layer MS cannot be formed well.

On the other hand, in the present embodiment, as shown in FIG. 2 to FIG. 5, a semiconductor portion EP2a, EP2b is formed on the semiconductor layer SMb, and a metal silicide layer MS is formed on the surface (upper layer portion) of each semiconductor portion EP2a, EP2b. Therefore, in the resistive element forming region 1B, the semiconductor portion EP2a, EP2b is present, it is possible to increase the thickness of the semiconductor region used to form the metal silicide layer MS (here semiconductor layer EP and the semiconductor layer SMb), the metal silicide layer MS it can be accurately formed.

The thickness of the semiconductor layer EP formed on the semiconductor layer SMb (semiconductor portion EP2a, EP2b) may be, for example, about 20 nm to 60 nm.

The semiconductor part EP2a, EP2b composing the resistive elements 3 can be formed by epitaxial growth in the same process as the semiconductor layers EP (semiconductor part EP1a, EP1b) composing the source/drain regions (n+ type semiconductor regions SDs) of the MISFET 2. Therefore, there is no need to add an epitaxial growth step to form the semiconducting portion EP2a, EP2b. An epitaxial growth step of forming a semiconductor portion EP2a, EP2b on the resistive element forming region 1B, and an epitaxial growth step of forming a semiconductor layer EP on the MISFET forming region 1A, can be commonized, it is possible to suppress the number of manufacturing steps of semiconductor device. Therefore, it is possible to suppress the manufacturing cost of semiconductor device.

In the present embodiment, a metal silicide layer MS is formed on the upper surface of each semiconductor portion EP2a, EP2b, and each of the plugs PG2a, PG2b is connected to the metal silicide layer MS. Thus, it is possible to reduce the connection resistance of each plug PG2a, PG2b as compared with the case where each plug PG2a, PG2b is directly connected to the semiconductor part EP2a, EP2b without forming the metal silicide layer MS.

In the upper surface of the semiconductor portion EP2a, the metal silicide layer MS is preferable separated from the side H1 of the semiconductor portion EP2a by a predetermined distance (e.g., 10 nm or more). Similarly, in upper surface of the semiconductor portion EP2b, the metal silicide layer MS is preferably separated from the side H2 of the semiconductor portion EP2b by a predetermined distance (e.g., 10 nm or more). Thus, when forming the insulating film pattern ZMP2 by patterning the insulating film ZM2, such as misalignment of the photomask, even if it occurs somewhat, the metal silicide layer MS on the surface of the semiconductor layer SMb position in the region RG2 it is possible to prevent from being formed. Thus, it is possible to secure a margin against misalignment of the photomask, it is easy to perform the method of manufacturing semiconductor device, facilitating process control.

Incidentally, the side H1 of EP2a of the semiconductor portion upper surface corresponds to the side of the side facing the semiconductor portion EP2b, also, the side H2 of upper surface of the semiconductor portion EP2b corresponds to the side of the side facing the semiconductor portion EP2a.

Modified Example

Next, a modification of the present embodiment device will be described.

Figure 27:
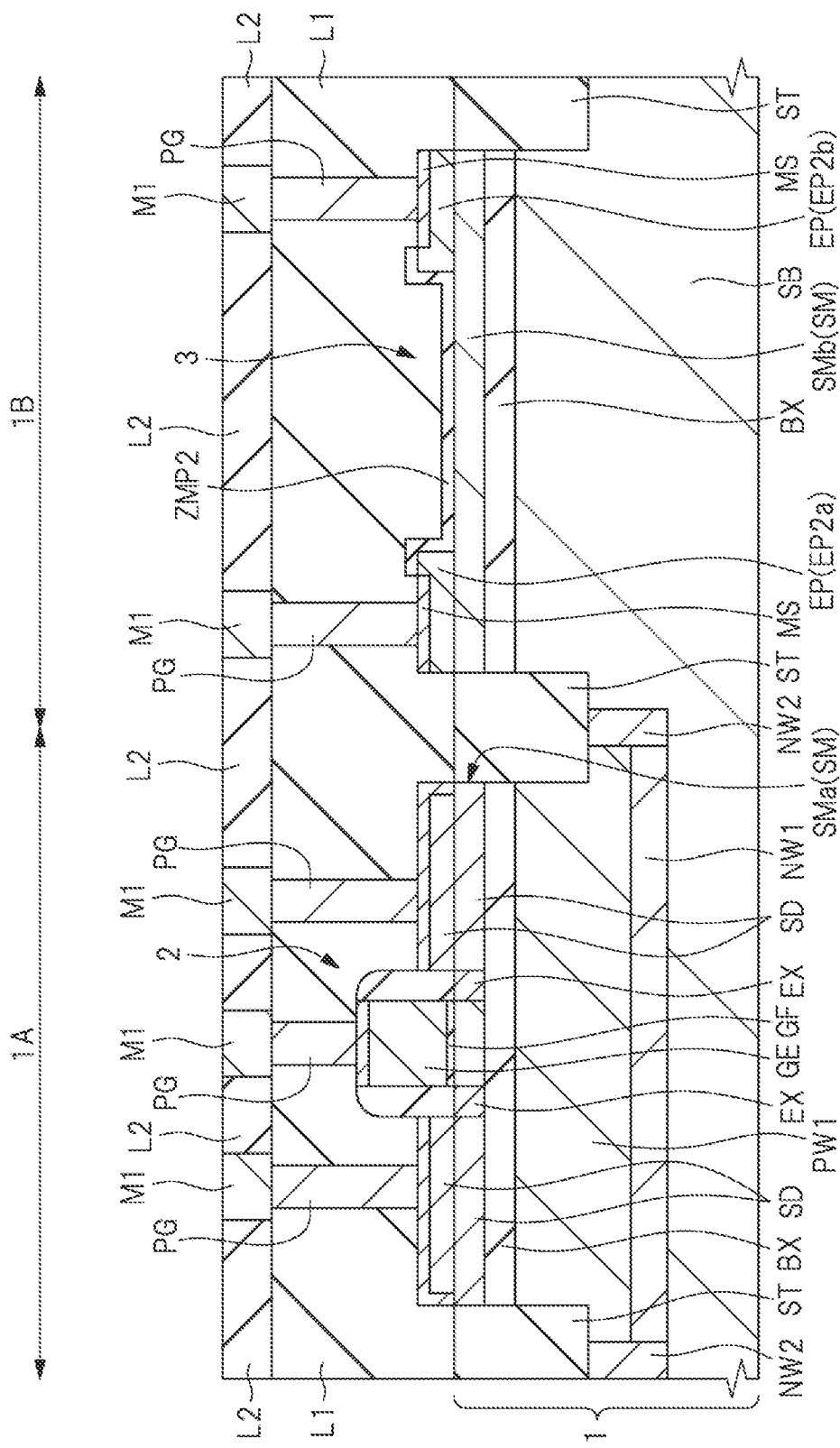
FIG. 27 is a partially enlarged cross-sectional view of a semiconductor device in modified example 1.

FIG. 27 is main portion cross-sectional view of semiconductor device of the first modified example of the present embodiment. In FIG. 27, a cross-section corresponding to the above FIG. 6 (cross section of the MISFET forming region 1A) and a cross section corresponding to the above FIG. 2 (cross section of the resistive element forming region 1B) are shown.

In case of FIG. 27 (first modified example), in the MISFET forming region 1A, forming a p-type semiconductor region (p-type well) PW1 in a semiconductor substrate SBs. The impurity concentration (p-type impurity concentration) of the p-type semiconductor region PW1 is higher than the impurity concentration (p-type impurity concentration) of the semiconductor substrate SB. The p-type semiconductor region PW1 is adjacent to the insulating layer BX. The p-type semiconductor region PW1 is below the semiconductor layer SMa, the insulating layer BX is interposed between the p-type semiconductor region PW1 and the semiconductor layer SMa. By supplying a predetermined potential to the p-type semiconductor region PW1, it is possible to control the threshold voltage of THE MISFET 2.

In the semiconductor substrate SBs, below the p-type semiconductor region PW1, so as to adjoin the p-type semiconductor region PW1, an n-type semiconductor region NW1 is formed. Further, in the semiconductor substrate SB, the n-type semiconductor region NW2 is formed below the element isolation region ST, the side surface of the p-type semiconductor region PW1 is surrounded by the element isolation region ST and the n-type semiconductor region NW2. Thus, the p-type semiconductor region PW1, since the state surrounded by the insulating layer BX and the element isolation region ST and the n-type semiconductor region NW1, NW2, the p-type semiconductor region PW1 of the MISFET forming region 1A, the resistive element forming region 1B it possible to electrically separate semiconductor substrate SB.

In case of FIG. 27 (first modified example), in the resistive element forming region 1B, those corresponding to the p-type semiconductor region PW1 in the semiconductor substrate SBs are not formed. Therefore, in the semiconductor substrate SB of the resistive element-forming region 1B, the impurity concentration (p-type impurity concentration) of the region adjoining the insulating layer BX is low, and can be, for example, less than $1 \times 10^{16}/cm^3$. In the semiconductor substrate SB of the resistive element forming region 1B, the impurity concentration (p-type impurity concentration) of the region adjoining insulating layer BX is lowered, so that the parasitic capacitance which can be formed between the semiconducting layer SMb and the semiconductor substrate SB in the resistive element forming region 1B can be suppressed.

Figure 28:
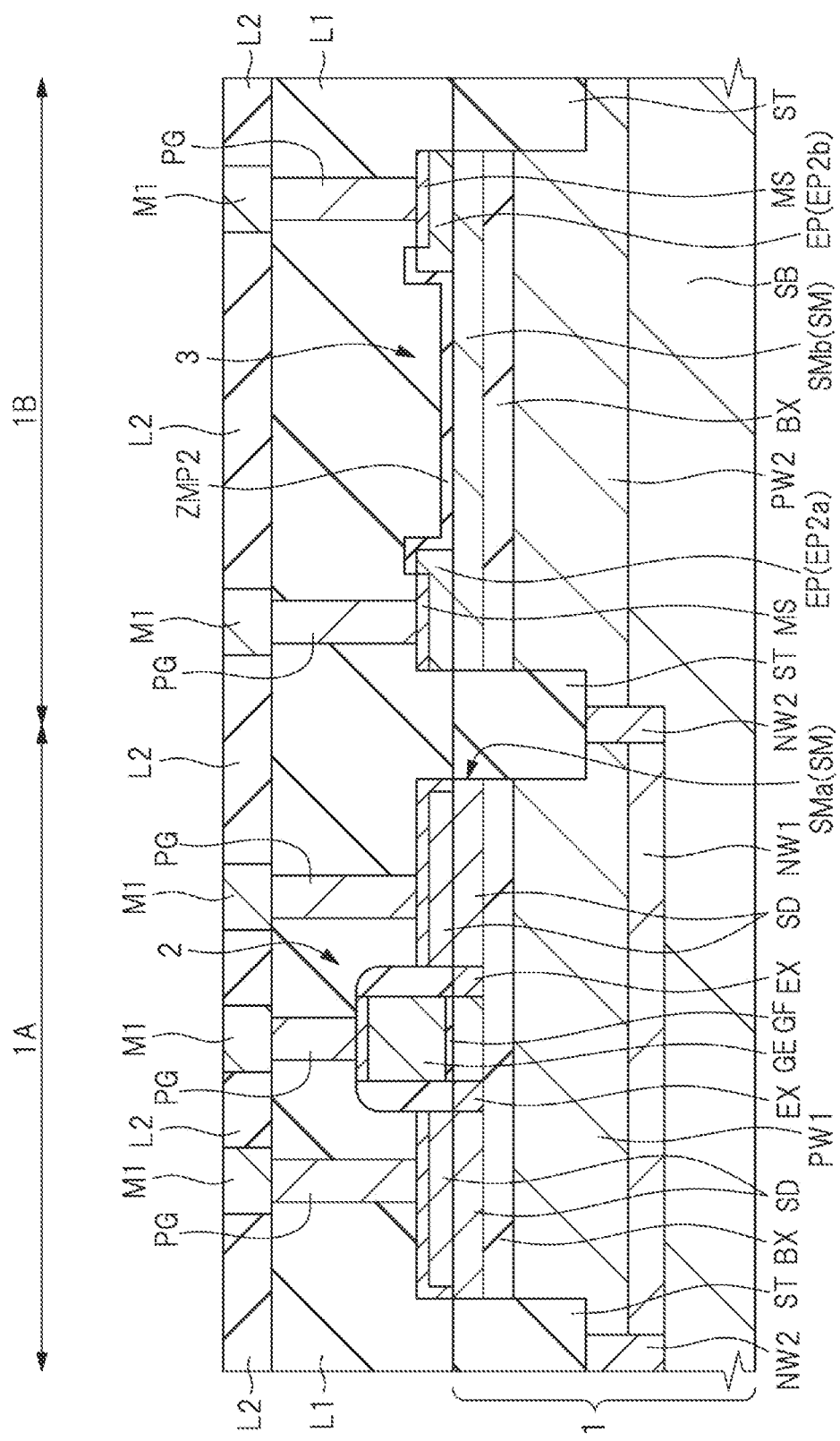
FIG. 28 is a partially enlarged cross-sectional view of a semiconductor device in modified example 2.

FIG. 28 main portion cross-sectional view of semiconductor device of the second modified example of the present embodiment, which corresponds to the above FIG. 27.

In case of FIG. 28 (second modified example), in the resistive element forming region 1B, forming a p-type semiconductor region (p-type well) PW2 in the semiconductor substrate SBs. The impurity concentration (p-type impurity concentration) of the p-type semiconductor region PW2 is higher than the impurity concentration (p-type impurity concentration) of the semiconductor substrate SB. The p-type semiconductor region PW2 is adjacent to the insulating layer BX. The p-type semiconductor region PW2 is below the semiconductor layer SMb, the insulating layer BX is interposed between the p-type semiconductor region PW2 and the semiconductor layer SMb. The p-type impurity concentration of the p-type semiconductor region PW2 can be, for example, about $1 \times 10^{16}/cm^3 \sim 1 \times 10^{18}/cm^3$. The impurity concentration (p-type impurity concentration) of the p-type semiconductor region PW2 and the impurity concentration (p-type impurity concentration) of the p-type semiconductor region PW1 can be made the same, and then the p-type semiconductor region PW2 and the p-type semiconductor region PW1 can be formed by the same ion implantation process. By supplying a predetermined potential to the p-type semiconductor region PW2, it is possible to control (change) the resistance of the resistive element 3. Otherwise, the second modified example of FIG. 28 is substantially similar to the first modified example of FIG. 27.

Figure 29:
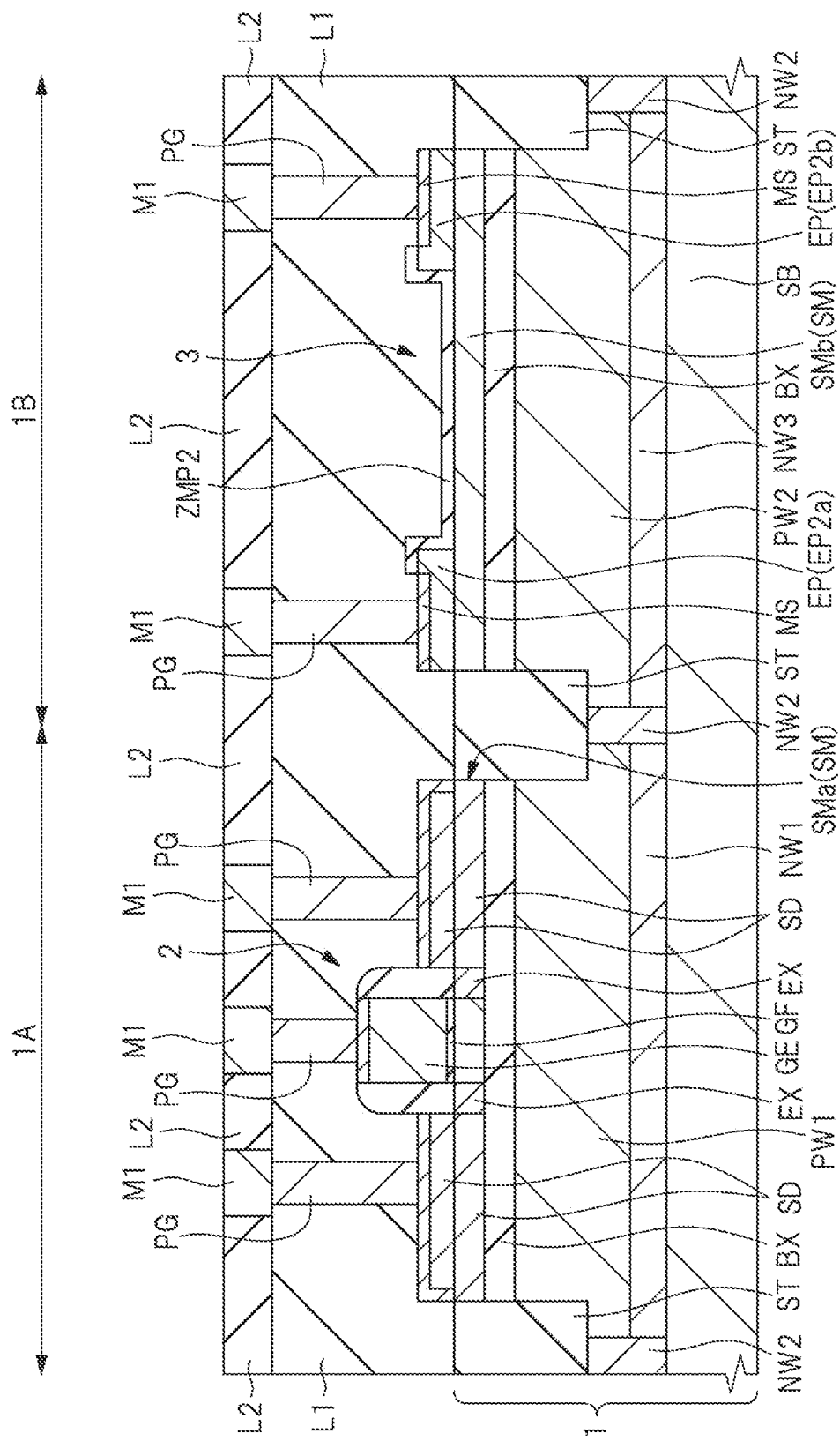
FIG. 29 is a partially enlarged cross-sectional view of a semiconductor device in modified example 3.

FIG. 29 is main portion cross-sectional view of semiconductor device of the third modified example of the present embodiment, which corresponds to the above FIG. 27.

In case of FIG. 29 (third modified example), in the semiconductor substrate SBs, below the p-type semiconductor region PW2, so as to adjoin the p-type semiconductor region PW2, n-type semiconductor region NW3 is formed. Further, in the semiconductor substrate SB, the n-type semiconductor region NW2 is formed below the element isolation region ST, the side surface of the p-type semiconductor region PW2 is surrounded by the element isolation region ST and the n-type semiconductor region NW2. Thus, the p-type semiconductor region PW2, since the state surrounded by the insulating layer BX and the element isolation region ST and the n-type semiconductor region NW2, NW3, the p-type semiconductor region of the MISFET forming region 1A and the p-type semiconductor region PW1, and the semiconductor substrate SB of the resistive element forming region 1B (p-type semiconductor region), more accurately, it is possible to electrically separate. Otherwise, the third modified example of FIG. 29 is substantially similar to the second modified example of FIG. 28.

The invention made by the present inventor has been described above in detail based on the embodiment, but the present invention is not limited to the embodiment described above, and it is needless to say that various modifications can be made without departing from the gist thereof.

What is claimed is:

1. A semiconductor device comprising:
   a substrate;
   a resistive element formed in a first region of the substrate; and
   a MISFET formed in a second region of the substrate,
   wherein the substrate includes:
      a supporting substrate;
      an insulating layer on the supporting substrate; and
      a semiconductor layer on the insulating layer,
   wherein the resistive element is comprised of:
      the semiconductor layer located in the first region; and
      an epitaxial semiconductor layer formed on the semiconductor layer located in the first region,
   wherein the epitaxial semiconductor layer located in the first region has:
      a first semiconductor portion formed on the semiconductor layer located in the first region; and
      a second semiconductor portion formed on the semiconductor layer located in the first region and spaced apart from the first semiconductor portion,
   wherein the semiconductor layer located in the first region has:
      a first connecting portion on which the first semiconductor portion is formed;
      a second connecting portion on which the second semiconductor portion is formed; and
      an element portion located between the first connecting portion and the second connecting portion and on which the epitaxial semiconductor layer is not formed, and
   wherein an impurity concentration of the element portion is $1 \times 10^{21}/cm^3$ or more.

2. The semiconductor device according to claim 1, wherein a metal silicide layer is formed, at a front surface of each of the first semiconductor portion and the second semiconductor portion, in each of the first semiconductor portion and the second semiconductor portion.

3. The semiconductor device according to claim 1, further comprising:
   an element isolation region formed in the substrate and penetrating through each of the semiconductor layer and the insulating layer, the element isolation region having a bottom portion reaching to the supporting substrate, wherein, in plan view, the semiconductor layer located in the first region is surrounded by the element isolation region.

4. The semiconductor device according to claim 3, wherein, in plan view, the semiconductor layer located in the second region is surrounded by the element isolation region, and
wherein the semiconductor layer located in the first region and the semiconductor layer located in the second region are spaced apart from each other by the element isolation region.

5. The semiconductor device according to claim 1, wherein the epitaxial semiconductor layer is formed on the semiconductor layer located in the second region,
wherein the epitaxial semiconductor layer located in the second region has:
  a third semiconductor portion formed on the semiconductor layer located in the second region; and
  a fourth semiconductor portion formed on the semiconductor layer located in the second region and spaced apart from the third semiconductor portion,
wherein the MISFET includes a gate electrode formed on the semiconductor layer located in the second region via a gate insulating film,
wherein a source region of the MISFET is formed in the semiconductor layer located in the second region and the third semiconductor portion, and
wherein a drain region of the MISFET is formed in the semiconductor layer located in the second region and the fourth semiconductor portion.

6. The semiconductor device according to claim 5, wherein, in plan view, the gate electrode is located between the third semiconductor portion and the fourth semiconductor portion.

7. The semiconductor device according to claim 5, wherein an impurity concentration of the element portion is the same as an impurity concentration of each of the source region and the drain region.

8. The semiconductor device according to claim 7, wherein the impurity concentration of each of the source region and the drain region is $1\times10^{21}/cm^3$ or more.

9. The semiconductor device according to claim 5, wherein a thickness of the element portion is less than a thickness of the gate electrode.

10. The semiconductor device according to claim 9, wherein the thickness of the element portion is the same as a thickness of the semiconductor layer below the gate electrode.

11. The semiconductor device according to claim 10, wherein the thickness of the element portion is 30 nm or less.

12. The semiconductor device according to claim 10, wherein the thickness of the element portion is 3 nm to 30 nm.

13. The semiconductor device according to claim 1, wherein a thickness of the element portion is 30 nm or less.

14. The semiconductor device according to claim 1, wherein a thickness of the element portion is 3 nm to 30 nm.

15. The semiconductor device according to claim 1, further comprising:
  an interlayer insulating film formed on the substrate such that the interlayer insulating film covers the semiconductor layer and the epitaxial semiconductor layer,
  wherein a plurality of conductive plugs is embedded in the interlayer insulating film, and
  wherein the plurality of conductive plugs includes:
    a first plug formed on the first semiconductor portion and electrically connected with the first semiconductor portion; and
    a second plug formed on the second semiconductor portion and electrically connected with the second semiconductor portion.

16. The semiconductor device according to claim 15, wherein a metal silicide layer is formed, at a front surface of each of the first semiconductor portion and the second semiconductor portion, in each of the first semiconductor portion and the second semiconductor portion,
wherein the first plug is in contact with the metal silicide layer formed, at the front surface of the first semiconductor portion, in the first semiconductor portion, and
wherein the second plug is in contact with the metal silicide layer formed, at the front surface of the second semiconductor portion, in the second semiconductor portion.

17. The semiconductor device according to claim 16, wherein a metal silicide layer is not formed, at a front surface of the semiconductor layer located in the first region, in the semiconductor layer located in the first region.

* * * * *